United States Patent
Kamuro et al.

(10) Patent No.: US 9,181,397 B2
(45) Date of Patent: Nov. 10, 2015

(54) CURABLE RESIN COMPOSITION AND CURED PRODUCT THEREOF

(71) Applicant: DAICEL CORPORATION, Osaka-shi, Osaka (JP)

(72) Inventors: Shigeaki Kamuro, Himeji (JP); Yasunobu Nakagawa, Ohtake (JP)

(73) Assignee: DAICEL CORPORATION, Osaka-Shi (JP)

( * ) Notice: Subject to any disclaimer, the term of this patent is extended or adjusted under 35 U.S.C. 154(b) by 0 days.

(21) Appl. No.: 14/364,471

(22) PCT Filed: Dec. 19, 2012

(86) PCT No.: PCT/JP2012/082871
§ 371 (c)(1),
(2) Date: Jun. 11, 2014

(87) PCT Pub. No.: WO2013/094625
PCT Pub. Date: Jun. 27, 2013

(65) Prior Publication Data
US 2014/0332987 A1 Nov. 13, 2014

(30) Foreign Application Priority Data

Dec. 22, 2011 (JP) ................................ 2011-282298

(51) Int. Cl.
| | | |
|---|---|---|
| *C08G 77/04* | (2006.01) | |
| *C08L 83/06* | (2006.01) | |
| *H01L 23/29* | (2006.01) | |
| *C08K 5/3492* | (2006.01) | |
| *C08L 83/04* | (2006.01) | |
| *C08G 77/12* | (2006.01) | |
| *C08G 77/20* | (2006.01) | |

(52) U.S. Cl.
CPC .............. *C08G 77/04* (2013.01); *C08G 77/045* (2013.01); *C08K 5/34926* (2013.01); *C08L 83/04* (2013.01); *C08L 83/06* (2013.01); *H01L 23/293* (2013.01); *H01L 23/296* (2013.01); *C08G 77/12* (2013.01); *C08G 77/20* (2013.01); *C08L 2203/206* (2013.01); *C08L 2205/025* (2013.01)

(58) Field of Classification Search
CPC .... C08G 77/20; C08G 77/80; C08K 5/34924; H01L 23/296
USPC .......................................................... 528/28
See application file for complete search history.

(56) References Cited

U.S. PATENT DOCUMENTS

| | | |
|---|---|---|
| 2013/0237663 A1 | 9/2013 | Carpentier et al. |
| 2014/0148536 A1 | 5/2014 | Kawabata et al. |
| 2015/0126700 A1 | 5/2015 | Kamuro et al. |

FOREIGN PATENT DOCUMENTS

| | | | |
|---|---|---|---|
| CN | 102 906 198 | * | 1/2013 |
| EP | 2 620 441 A1 | | 7/2013 |
| EP | 2 730 603 A1 | | 5/2014 |
| EP | 2 857 457 A1 | | 4/2015 |
| JP | 2002-314140 A | | 10/2002 |
| JP | 2004-196958 A | | 7/2004 |
| JP | 2005-68268 A | | 3/2005 |
| JP | 2005-307015 A | | 11/2005 |
| JP | 2007-31619 A | | 2/2007 |
| JP | 2008-222881 A | | 9/2008 |
| WO | WO 2011/111667 A1 | | 9/2011 |

OTHER PUBLICATIONS

CN 102 906 198 machine translation.*
International Search Report issued in PCT/JP2012/082871, mailed on Apr. 2, 2013.
Extended European Search Report for Application No. 12860827.0 dated Jul. 7, 2015.

* cited by examiner

*Primary Examiner* — Kuo-Liang Peng
(74) *Attorney, Agent, or Firm* — Birch, Stewart, Kolasch & Birch, LLP

(57) ABSTRACT

Provided is a curable resin composition capable of forming a cured product which has excellent heat resistance, transparency, and flexibility and particularly excels in reflow resistance and barrier properties to a corrosive gas. The curable resin composition includes a ladder-type polyorganosilsesquioxane and an isocyanurate compound such as a triglycidyl isocyanurate compound, a monoallyl diglycidyl isocyanurate compound, a diallyl monoglycidyl isocyanurate compound, or a triallyl isocyanurate compound.

25 Claims, 2 Drawing Sheets

[Fig. 1]
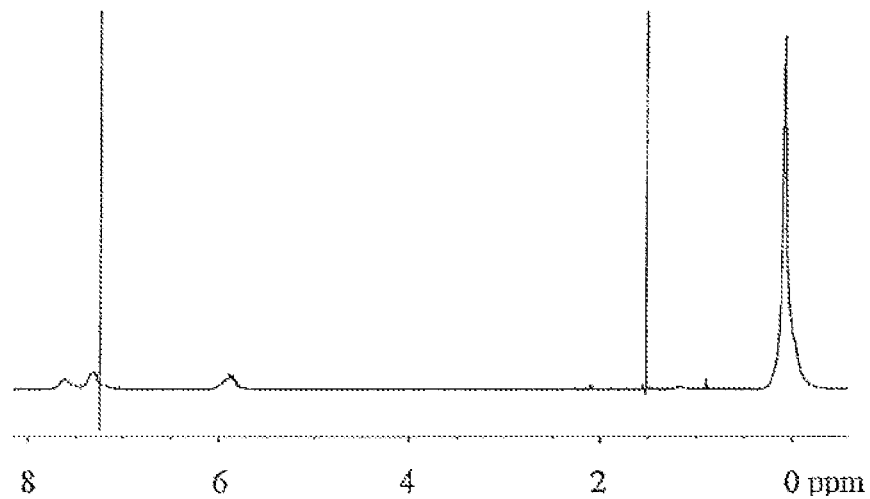
Fig. 2
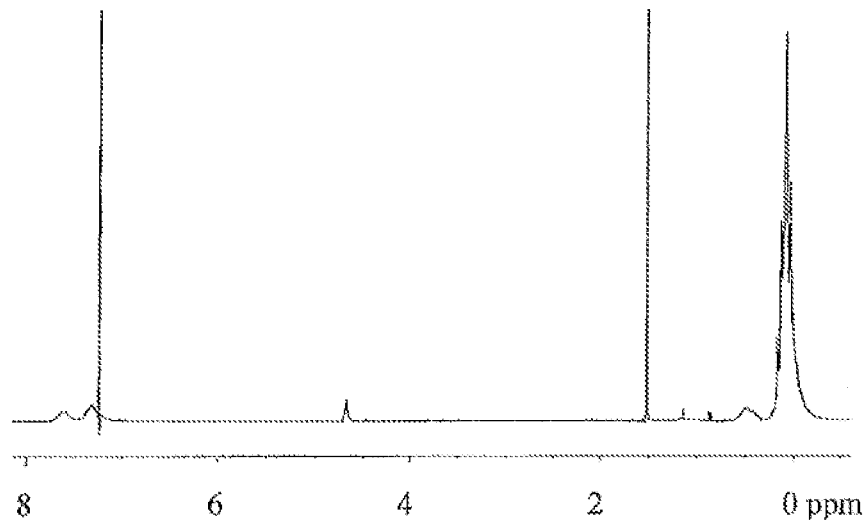

CURABLE RESIN COMPOSITION AND CURED PRODUCT THEREOF

TECHNICAL FIELD

The present invention relates to a curable resin composition and a cured product thereof.

BACKGROUND ART

Materials having heat resistance of 150° C. or higher are demanded so as to cover (coat) semiconductor elements in semiconductor devices of high heat resistance and high breakdown voltage. Among them, materials (encapsulants) for covering optical materials such as optical semiconductor elements require excelling not only in heat resistance, but also in other properties such as transparency and flexibility. Phenylsilicones are now mainly used as encapsulants typically in backlight units of liquid crystal displays.

Patent Literature (PTL) 1 discloses a resin composition for optical element encapsulation, where the resin composition excels in transparency, ultraviolet resistance, and thermal coloration resistance. The resin composition for optical element encapsulation contains, as a resin component, at least one silsesquioxane selected from the group consisting of a liquid cage-structure silsesquioxane containing an aliphatic carbon-carbon unsaturated bond and containing no H—Si bond; and a liquid cage-structure silsesquioxane containing an H—Si bond and containing no aliphatic carbon-carbon unsaturated bond. The resin composition containing such a cage silsesquioxane, however, gives a cured product that is relatively hard, has poor flexibility, and is disadvantageously susceptible to cracking and fracture.

PTL 2 discloses a curable composition that contains a triallyl isocyanurate or another organic compound containing at least two carbon-carbon double bonds per molecule, where the carbon-carbon double bonds are reactive with SiH group; a chain and/or cyclic polyorganosiloxane or another compound containing at least two SiH groups per molecule; and a hydrosilylation catalyst as essential components. These materials, however, are still insufficient in properties such as cracking resistance.

CITATION LIST

Patent Literature

PTL 1: Japanese Unexamined Patent Application Publication (JP-A) No. 2007-031619
PTL 2: JP-A No. 2002-314140

SUMMARY OF INVENTION

Technical Problem

An encapsulant for an optical semiconductor element generally requires not only the heat resistance, transparency, and flexibility, but also such properties as to resist degradation even when heat at a high temperature is applied in a reflow process in optical semiconductor device production. Specifically, the properties upon the reflow process are such that the encapsulant is resistant to cracking and does not cause disadvantages such as separation from a package. The properties are hereinafter also generically referred to as "reflow resistance". In addition, the property of the encapsulant as to be resistant to cracking is herein also referred to as "cracking resistance".

The encapsulant for an optical semiconductor element also requires high barrier properties to a corrosive gas such as a SOx gas. This is because metal materials typically for electrodes in an optical semiconductor device are readily corroded by the corrosive gas; and the corrosion disadvantageously degrades electrical properties (e.g., electrical properties in a high-temperature environment) of the semiconductor device with time. The phenylsilicone encapsulants now widely used as encapsulants for optical semiconductor elements disadvantageously have insufficient barrier properties to the corrosive gas.

Accordingly, an object of the present invention is to provide a curable resin composition capable of forming a cured product which has excellent heat resistance, transparency, and flexibility and which excels particularly in reflow resistance (e.g., cracking resistance in a reflow process and adhesion to a package) and barrier properties to a corrosive gas.

Another object of the present invention is to provide a cured product which has excellent heat resistance, transparency, and flexibility and which excels particularly in reflow resistance and barrier properties to a corrosive gas.

Solution to Problem

The present inventors have found a curable resin composition including a ladder-type polyorganosilsesquioxane in combination with an isocyanurate compound having a specific structure as essential components; and have found that the curable resin composition is capable of forming a cured product which has excellent heat resistance, transparency, and flexibility and which excels particularly in reflow resistance and barrier properties to a corrosive gas. The present invention has been made based on these findings.

Specifically, the present invention provides a curable resin composition including a ladder-type polyorganosilsesquioxane; and an isocyanurate compound represented by Formula (8) expressed as follows:

[Chem. 1]

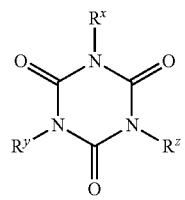

(8)

where $R^x$, $R^y$, and $R^z$ may be the same or different and are independently selected from the group consisting of a group represented by Formula (9) and a group represented by Formula (10), where Formulae (9) and (10) are expressed as follows:

[Chem. 2]

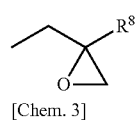

(9)

[Chem. 3]

-continued

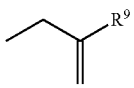
(10)

where $R^8$ and $R^9$ may be the same or different and are independently selected from the group consisting of hydrogen atom and a straight- or branched-chain alkyl group having 1 to 8 carbon atoms.

In the curable resin composition, at least one of $R^x$, $R^y$, and $R^z$ in Formula (8) is preferably a group represented by Formula (10).

The curable resin composition may include a ladder-type silsesquioxane (A) as the ladder-type polyorganosilsesquioxane, where the ladder-type silsesquioxane (A) includes a polyorganosilsesquioxane having a ladder structure; and a polyorganosilsesquioxane residue in part or all of molecular chain terminals of the polyorganosilsesquioxane, and the polyorganosilsesquioxane residue includes a unit structure represented by Formula (1) and a unit structure represented by Formula (2), Formula (1) is expressed as follows:

[Chem. 4]

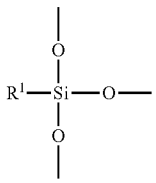
(1)

where $R^1$ is a group having an aliphatic carbon-carbon double bond,
and Formula (2) is expressed as follows:

[Chem. 5]

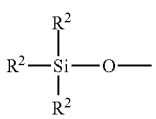
(2)

where $R^2$s are each independently a hydrocarbon group.

The curable resin composition may include a ladder-type silsesquioxane (B) as the ladder-type polyorganosilsesquioxane, where the ladder-type silsesquioxane (B) includes a polyorganosilsesquioxane having a ladder structure; and a polyorganosilsesquioxane residue in part or all of molecular chain terminals of the polyorganosilsesquioxane, the polyorganosilsesquioxane residue includes a unit structure represented by Formula (3) and a unit structure represented by Formula (4), Formula (3) is expressed as follows:

[Chem. 6]

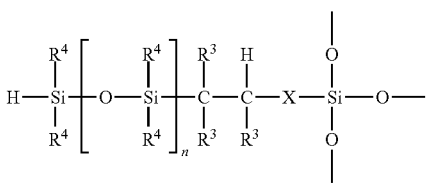
(3)

where X is selected from the group consisting of single bond and a linkage group; a plurality of $R^3$s are independently selected from the group consisting of hydrogen atom, a halogen atom, a monovalent organic group, a monovalent oxygen-containing group, a monovalent nitrogen-containing group, and a monovalent sulfur-containing group; a plurality of $R^4$s are independently selected from the group consisting of hydrogen atom, a halogen atom, a monovalent organic group, a monovalent oxygen-containing group, a monovalent nitrogen-containing group, and a monovalent sulfur-containing group; and n represents an integer of from 1 to 100, and Formula (4) is expressed as follows:

[Chem. 7]

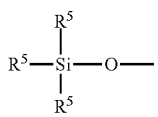
(4)

where $R^5$s are each independently a hydrocarbon group.

In the curable resin composition, part or all of side chains of the ladder-type polyorganosilsesquioxane may be substituted or unsubstituted aryl groups.

The curable resin composition may further include a silane coupling agent.

The curable resin composition may further include a cyclic siloxane (C) having two or more aliphatic carbon-carbon double bonds per molecule; and a cyclic siloxane (D) having two or more hydrosilyl groups per molecule.

The present invention further provides a cured product obtained by curing the curable resin composition.

The present invention further provides an encapsulating agent including the curable resin composition.

In addition and advantageously, the present invention provides a semiconductor device obtained by encapsulating a semiconductor element with the encapsulating agent.

Advantageous Effects of Invention

The curable resin composition according to an embodiment of the present invention has the configuration and is capable of forming a cured product that has excellent heat resistance, transparency, and flexibility. In particular, the cured product excels in reflow resistance, more specifically, reflow resistance such as cracking resistance and adhesion to a package in a reflow process and also excels in barrier properties to a corrosive gas such as a $SO_x$ gas. The curable resin composition according to the embodiment of the present invention is preferably usable as an encapsulating agent for an optical semiconductor element (light-emitting diode (LED)). An optical semiconductor device obtained by encapsulating an optical semiconductor element with a cured product of the curable resin composition according to the embodiment of the present invention has excellent quality and satisfactory durability. The curable resin composition according to the embodiment of the present invention is therefore useful particularly as an encapsulating agent for a next-generation light source, in which heat resistance to an unprecedented high temperature (e.g., 180° C. or higher) is required.

BRIEF DESCRIPTION OF DRAWINGS

FIG. 1 depicts a $^1$H-NMR spectrum chart of a ladder-type silsesquioxane obtained in Synthetic Example 1 and having vinyl group and TMS group in terminals.

FIG. 2 depicts a $^1$H-NMR spectrum chart of a ladder-type silsesquioxane obtained in Synthetic Example 2 and having SiH-containing group and TMS group in terminals.

DESCRIPTION OF EMBODIMENTS

Curable Resin Composition

Figure 3:
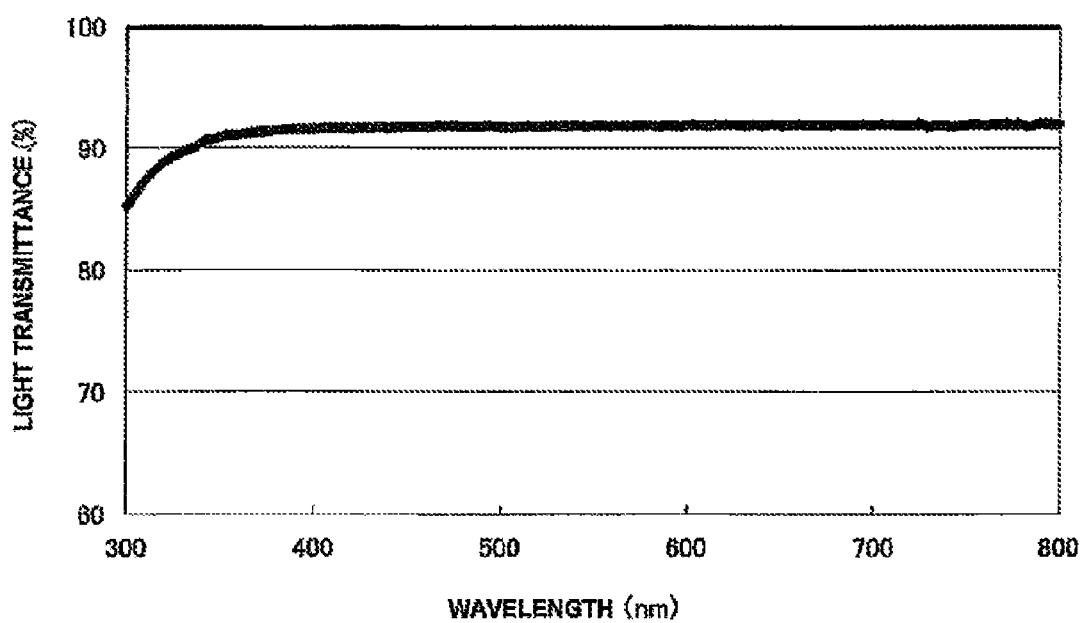
FIG. 3 is a graph illustrating the light transmittance of Cured Product 1 with respect to light at wavelengths of from 300 to 800 nm, where Cured Product 1 was obtained in Example 1.

The curable resin composition according to the embodiment of the present invention is a curable resin composition that includes a ladder-type polyorganosilsesquioxane and an isocyanurate compound represented by Formula (8) as essential components, where Formula (8) is expressed as follows:

[Chem. 8]

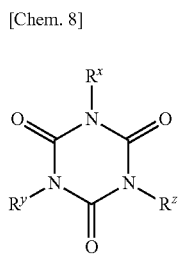

(8)

where $R^x$, $R^y$, and $R^z$ may be the same or different and are independently selected from the group consisting of a group represented by Formula (9) and a group represented by Formula (10), where Formulae (9) and (10) are expressed as follows:

[Chem. 9]

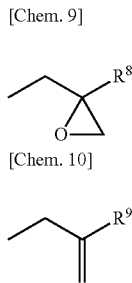

(9)

[Chem. 10]

(10)

where $R^8$ and $R^9$ may be the same or different and are independently selected from the group consisting of hydrogen atom and a straight- or branched-chain alkyl group having 1 to 8 carbon atoms.

Isocyanurate Compound

The curable resin composition according to the embodiment of the present invention includes an isocyanurate compound represented by Formula (8). The curable resin composition according to the embodiment of the present invention includes the isocyanurate compound and readily gives, through curing, a cured product that has better barrier properties to a corrosive gas and exhibits better adhesion to an adherend.

In Formula (8), $R^x$, $R^y$, and $R^z$ may be the same or different and are independently selected from the group consisting of a group represented by Formula (9) and a group represented by Formula (10). Particularly, at least one of $R^x$, $R^y$, and $R^z$ in Formula (8) is preferably the group represented by Formula (10).

In Formulae (9) and (10), $R^8$ and $R^9$ may be the same or different and are independently selected from the group consisting of hydrogen atom and a straight- or branched-chain alkyl group having 1 to 8 carbon atoms. The straight- or branched-chain alkyl group having 1 to 8 carbon atoms is exemplified by methyl group, ethyl group, propyl group, isopropyl group, butyl group, isobutyl group, s-butyl group, pentyl group, hexyl group, heptyl group, octyl group, and ethylhexyl group. Of the alkyl groups, preferred are straight- or branched-chain alkyl groups having 1 to 3 carbon atoms, such as methyl group, ethyl group, propyl group, and isopropyl group. $R^8$ and $R^9$ in Formulae (9) and (10) are each preferably hydrogen atom.

The isocyanurate compound is exemplified by a monoallyl diglycidyl isocyanurate compound, a diallyl monoglycidyl isocyanurate compound, and a triallyl isocyanurate compound.

The monoallyl diglycidyl isocyanurate compound is specifically exemplified by monoallyl diglycidyl isocyanurate, 1-allyl-3,5-bis(2-methylepoxypropyl) isocyanurate, 1-(2-methyl propenyl)-3,5-diglycidyl isocyanurate, and 1-(2-methylpropenyl)-3,5-bis(2-methylepoxypropyl) isocyanurate. The diallyl monoglycidyl isocyanurate compound is specifically exemplified by diallyl monoglycidyl isocyanurate, 1,3-diallyl-5-(2-methylepoxypropyl) isocyanurate, 1,3-bis(2-methylpropenyl)-5-glycidyl isocyanurate, and 1,3-bis(2-methylpropenyl)-5-(2-methylepoxypropyl) isocyanurate. The triallyl isocyanurate compound is specifically exemplified by triallyl isocyanurate and tris(2-methylpropenyl) isocyanurate. Each of different isocyanurate compounds may be used alone or in combination.

The monoallyl diglycidyl isocyanurate compound and the diallyl monoglycidyl isocyanurate compound may each be modified before use by reacting the compound with an alcohol, an acid anhydride, or another compound that is reactive with epoxy group.

The isocyanurate compound, particularly when having the group represented by Formula (10), may also be subjected to a reaction (hydrosilylation) with a hydrosilyl-containing compound before use. Typically, the monoallyl diglycidyl isocyanurate compound may be reacted with the after-mentioned ladder-type silsesquioxane (B) in the presence of a hydrosilylation catalyst to give a component to be used in the curable resin composition according to the embodiment of the present invention. Alternatively, the monoallyl diglycidyl isocyanurate compound may be reacted with the after-mentioned cyclic siloxane (D) in the presence of a hydrosilylation catalyst to give a component to be used in the curable resin composition according to the embodiment of the present invention. The hydrosilylation catalyst is exemplified by those which will be exemplified in a production method of the ladder-type silsesquioxane (B). Conditions for the hydrosilylation reaction to be applied may be suitably selected from known or common hydrosilylation reaction conditions.

The isocyanurate compound may be mixed with a silane coupling agent before mixing with other components as described later, for better compatibility with the other components.

The curable resin composition may contain the isocyanurate compound in a content not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The curable resin composition, if containing the isocyanurate compound in a content of less than 0.01 percent by weight, may give a cured product that has inferior barrier properties to a corrosive gas and insufficient adhesion to an adherend. In contrast, the curable resin composition, if containing the isocyanurate compound in a content of greater than 10 percent by weight, may suffer from precipitation of a solid or may cause the cured product to be cloudy.

Ladder-Type Polyorganosilsesquioxane

The curable resin composition according to the embodiment of the present invention includes a ladder-type polyorganosilsesquioxane. The ladder-type polyorganosilsesquioxane is a polysiloxane represented by an empirical formula (basic structural formula) of $RSiO_{1.5}$ and is a polyorganosisesquioxane including at least a ladder-like Si—O—Si structure (ladder structure) per molecule. The ladder-type polyorganosilsesquioxane to be used can be any of known or common polyorganosilsesquioxanes having the structure without limitation. Among them, preferred are those having one or more (more preferably two or more) aliphatic carbon-carbon double bonds per molecule and those having one or more (more preferably two or more) hydrosilyl groups per molecule; of which a ladder-type silsesquioxane (A) and a ladder-type silsesquioxane (B) as mentioned below are particularly preferred.

Ladder-Type Silsesquioxane (A)

The ladder-type silsesquioxane (A) for use in the curable resin composition according to the embodiment of the present invention includes a polyorganosilsesquioxane (polyorganosilsesquioxane skeleton) having a ladder structure; and a polyorganosilsesquioxane residue (a) in part or all of molecular chain terminals of the polyorganosilsesquioxane, where the polyorganosilsesquioxane residue (a) includes a unit structure represented by Formula (1) and a unit structure represented by Formula (2) as mentioned later.

The polyorganosilsesquioxane in the ladder-type silsesquioxane (A) is a polysiloxane represented by an empirical formula (basic structural formula) of $RSiO_{1.5}$. R is selected from the group consisting of hydrogen atom, a halogen atom, a monovalent organic group, a monovalent oxygen-containing group, a monovalent nitrogen-containing group, and a monovalent sulfur-containing group, where at least part of Rs (Rs in the polyorganosilsesquioxane) is a monovalent organic group. Rs in the polyorganosilsesquioxane may be the same as or different from one another.

The halogen atom as Rs is exemplified by fluorine atom, chlorine atom, bromine atom, and iodine atom. The monovalent organic group as Rs is exemplified by substituted or unsubstituted hydrocarbon groups (monovalent hydrocarbon groups), alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, and isothiocyanato group.

The hydrocarbon groups as Rs are exemplified by aliphatic hydrocarbon groups, alicyclic hydrocarbon groups, aromatic hydrocarbon groups, and groups each including two or more of them bonded to each other.

The aliphatic hydrocarbon groups as Rs are exemplified by alkyl groups, alkenyl groups, and alkynyl groups. The alkyl groups are exemplified by $C_1$-$C_{20}$ alkyl groups such as methyl group, ethyl group, propyl group, isopropyl group, butyl group, hexyl group, octyl group, isooctyl group, decyl group, and dodecyl group; of which $C_1$-$C_{10}$ alkyl groups are preferred, and $C_1$-$C_4$ alkyl groups are more preferred. The alkenyl groups are exemplified by $C_2$-$C_{20}$ alkenyl groups such as vinyl group, allyl group, methallyl group, 1-propenyl group, isopropenyl group, 1-butenyl group, 2-butenyl group, 3-butenyl group, 1-pentenyl group, 2-pentenyl group, 3-pentenyl group, 4-pentenyl group, and 5-hexenyl group; of which $C_2$-$C_{10}$ alkenyl groups are preferred, and $C_2$-$C_4$ alkenyl groups are more preferred. The alkynyl groups are exemplified by $C_2$-$C_{20}$ alkynyl groups such as ethynyl group and propynyl group; of which $C_2$-$C_{10}$ alkynyl groups are preferred, and $C_2$-$C_4$ alkynyl groups are more preferred.

The alicyclic hydrocarbon groups as Rs are exemplified by $C_3$-$C_{12}$ cycloalkyl groups such as cyclopropyl group, cyclobutyl group, cyclopentyl group, cyclohexyl group, and cyclododecyl group; $C_3$-$C_{12}$ cycloalkenyl groups such as cyclohexenyl group; and $C_4$-$C_{15}$ bridged hydrocarbon groups such as bicycloheptyl group and bicycloheptenyl group.

The aromatic hydrocarbon groups as Rs are exemplified by $C_6$-$C_{14}$ aryl groups such as phenyl group and naphthyl group; of which $C_6$-$C_{10}$ aryl groups are preferred.

The groups as Rs including an aliphatic hydrocarbon group and an alicyclic hydrocarbon group bonded to each other are exemplified by cyclohexylmethyl group and methylcyclohexyl group. The groups including an aliphatic hydrocarbon group and an aromatic hydrocarbon group bonded to each other are exemplified by $C_7$-$C_{18}$ aralkyl groups such as benzyl group and phenethyl group, of which $C_7$-$C_{10}$ aralkyl groups are preferred; ($C_6$-$C_{10}$ aryl)-($C_2$-$C_6$ alkenyl) groups such as cinnamyl group; ($C_1$-$C_4$ alkyl)-substituted aryl groups such as tolyl group; and ($C_2$-$C_4$ alkenyl)-substituted aryl groups such as styryl group.

The hydrocarbon groups as Rs may each have one or more substituents. The substituents in the hydrocarbon groups may each have preferably 0 to 20 carbon atoms, and more preferably 0 to 10 carbon atoms. The substituents are exemplified by halogen atoms such as fluorine atom, chlorine atom, bromine atom, and iodine atom; hydroxyl group; alkoxy groups such as methoxy group, ethoxy group, propoxy group, isopropyloxy group, butoxy group, and isobutyloxy group, of which $C_1$-$C_6$ alkoxy groups are preferred, and $C_1$-$C_4$ alkoxy groups are more preferred; alkenyloxy groups such as allyloxy group, of which $C_2$-$C_6$ alkenyloxy groups are preferred, and $C_2$-$C_4$ alkenyloxy groups are more preferred; aryloxy groups which may have one or more substituents (e.g., a $C_1$-$C_4$ alkyl group, a $C_2$-$C_4$ alkenyl group, a halogen atom, and/or a $C_1$-$C_4$ alkoxy group) on the aromatic ring, such as phenoxy group, tolyloxy group, and naphthyloxy group, of which $C_6$-$C_{14}$ aryloxy groups are preferred; aralkyloxy groups such as benzyloxy group and phenethyloxy group, of which $C_1$-$C_{18}$ aralkyloxy groups are preferred; acyloxy groups such as acetyloxy group, propionyloxy group, (meth)acryloyloxy group, and benzoyloxy group, of which $C_1$-$C_{12}$ acyloxy groups are preferred; mercapto group; alkylthio groups such as methylthio group and ethylthio group, of which $C_1$-$C_6$ alkylthio groups are preferred, and $C_1$-$C_4$ alkylthio groups are more preferred; alkenylthio groups such as allylthio group, of which $C_2$-$C_6$ alkenylthio groups are preferred, and $C_2$-$C_4$ alkenylthio groups are more preferred; arylthio groups which may have one or more substituents (e.g., a $C_1$-$C_4$ alkyl group, a $C_2$-$C_4$ alkenyl group, a halogen atom, and/or a $C_1$-$C_4$ alkoxy group) on the aromatic ring, such as phenylthio group, tolylthio group, and naphthylthio group, of which $C_6$-$C_{14}$ arylthio groups are preferred; aralkylthio groups such as benzylthio group and phenethylthio group, of which $C_7$-$C_{18}$ aralkylthio groups are preferred; carboxyl group; alkoxycarbonyl groups such as methoxycarbonyl group, ethoxycarbonyl group, propoxycarbonyl group, and butoxycarbonyl group, of which $C_1$-$C_6$ alkoxy-carbonyl groups are preferred; aryloxycarbonyl groups such as phenoxycarbonyl group, tolyloxycarbonyl group, and naphthyloxycarbonyl group, of which ($C_6$-$C_{14}$ aryloxy)-carbonyl groups are preferred; aralkyloxycarbonyl groups such as benzyloxycarbonyl group, of which ($C_7$-$C_{18}$ aralkyloxy)-carbonyl groups are preferred; amino group; mono- or di-alkylamino groups such as methylamino group, ethylamino group, dimethylamino group, and diethylamino group, of which mono- or di-($C_1$-$C_6$ alkyl)amino groups are preferred; acylamino groups such as acetylamino group, propionylamino group, and benzoylamino group, of which ($C_1$-$C_{11}$ acyl)amino groups are preferred; epoxy-containing groups such as glycidyloxy group; oxetanyl-containing groups such as ethyloxetanyloxy group; acyl groups such as acetyl group, propionyl group, and benzoyl group; oxo group; and groups each including two or more of them bonded to each other, where necessary, via a $C_1$-$C_6$ alkylene group.

The monovalent oxygen-containing groups as Rs are exemplified by hydroxyl group, hydroperoxy group, alkenyloxy groups, aryloxy groups, aralkyloxy groups, acyloxy groups, isocyanato group, sulfo group, and carbamoyl group. The monovalent nitrogen-containing groups are exemplified by amino group or substituted amino groups (e.g., mono- or di-alkylamino groups and acylamino groups), cyano group, isocyanato group, isothiocyanato group, and carbamoyl group. The monovalent sulfur-containing groups are exemplified by mercapto group (thiol group), sulfo group, alkylthio groups, alkenylthio groups, arylthio groups, aralkylthio groups, and isothiocyanato group. The monovalent organic groups, monovalent oxygen-containing groups, monovalent nitrogen-containing groups, and monovalent sulfur-containing groups can overlap each other.

Examples of Rs further include a group represented by Formula (s) expressed as follows:

[Chem. 11]

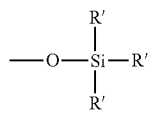

(s)

A plurality of R's in Formula (s) may be the same as or different from each other. R's in Formula (s) are independently selected from hydrogen atom, a halogen atom, a monovalent organic group, a monovalent oxygen-containing group, a monovalent nitrogen-containing group, and a monovalent sulfur-containing group. These groups are exemplified by the groups as with Rs.

R's in the group represented by Formula (s) are independently preferably selected from hydrogen atom, a $C_1$-$C_{10}$ alkyl group (of which a $C_1$-$C_4$ alkyl group is preferred), a $C_2$-$C_{10}$ alkenyl group (of which a $C_2$-$C_4$ alkenyl group is preferred), a $C_3$-$C_{12}$ cycloalkyl group, a $C_3$-$C_{12}$ cycloalkenyl group, a $C_6$-$C_{14}$ aryl group which may have one or more substituents (e.g., a $C_1$-$C_4$ alkyl group, a $C_2$-$C_4$ alkenyl group, a halogen atom, and/or a $C_1$-$C_4$ alkoxy group) on the aromatic ring, a $C_7$-$C_{16}$ aralkyl group, a ($C_6$-$C_{10}$ aryl)-$C_2$-$C_6$ alkenyl group, hydroxyl group, a $C_1$-$C_6$ alkoxy group, and a halogen atom.

Among them, Rs are independently preferably selected from hydrogen atom and a substituted or unsubstituted hydrocarbon group; more preferably selected from a substituted or unsubstituted hydrocarbon group; and furthermore preferably selected from an aliphatic hydrocarbon group (of which an alkyl group is preferred) and an aromatic hydrocarbon group (of which phenyl group is preferred).

In general, the structures of a polyorganosilsesquioxane is generally exemplified by a ladder-like Si—O—Si structure (ladder structure), a cage-like Si—O—Si structure (cage structure), and a random Si—O—Si structure (random structure). The polyorganosilsesquioxane in the ladder-type silsesquioxane (A) is a polyorganosilsesquioxane including at least the ladder structure (ladder-structure polyorganosisesquioxane).

The polyorganosilsesquioxane in the ladder-type silsesquioxane (A) may be represented typically by Formula (L) as follows:

[Chem. 12]

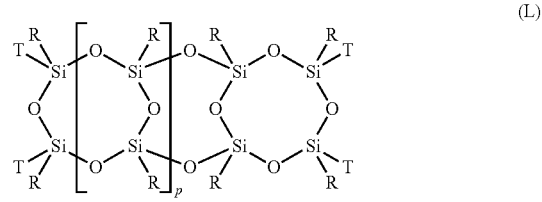

(L)

In Formula (L), p represents an integer of 1 or more (e.g., 1 to 5000), is preferably an integer of from 1 to 2000, and is more preferably an integer of from 1 to 1000. Rs in Formula (L) are the same as Rs as mentioned above. Ts are each independently a terminal group.

Groups (R in the empirical formula, such as Rs (side chains) in Formula (L)) directly bonded to silicon atoms in the polyorganosilsesquioxane in the ladder-type silsesquioxane (A) may include substituted or unsubstituted hydrocarbon groups in a percentage not critical, but preferably 50 mole percent or more, more preferably 80 mole percent or more, and furthermore preferably 90 mole percent or more, based on the total amount (100 mole percent) of the groups. In particular, the total content of specific groups based on the total amount (100 mole percent) of the groups is preferably 50 mole percent or more, more preferably 80 mole percent or more, and furthermore preferably 90 mole percent or more, where the specific groups are substituted or unsubstituted alkyl groups having 1 to 10 carbon atoms (particularly alkyl groups having 1 to 4 carbon atoms, such as methyl group and ethyl group), substituted or unsubstituted aryl group having 6 to 10 carbon atoms (particularly phenyl group), and substituted or unsubstituted aralkyl groups having 7 to 10 carbon atoms (particularly benzyl group).

The ladder-type silsesquioxane (A) preferably includes a substituted or unsubstituted aryl group (aromatic hydrocarbon group) in part or all of its side chains. This is preferred particularly from the viewpoint of helping the cured product to have satisfactory barrier properties to a corrosive gas. The term "side chains" refers to moieties branched from the ladder-structure polyorganosilsesquioxane skeleton as the main backbone (principal chain); such as Rs in Formula (L).

The ladder-type silsesquioxane (A) has a polyorganosilsesquioxane residue (a) in part or all of molecular chain terminals of the ladder-structure polyorganosilsesquioxane. When the polyorganosilsesquioxane is represented by Formula (L), the ladder-type silsesquioxane (A) has such a structure that part or all of Ts in Formula (L) are substituted with the polyorganosilsesquioxane residue (a).

The polyorganosilsesquioxane residue (a) is a residue including at least a unit structure represented by Formula (1) and a unit structure represented by Formula (2), where Formulae (1) and (2) are expressed as follows:

[Chem. 13]

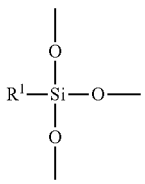

(1)

[Chem. 14]

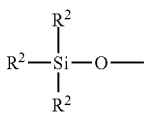

(2)

$R^1$ in Formula (1) is a group having an aliphatic carbon-carbon double bond. The group having an aliphatic carbon-carbon double bond is exemplified by $C_2$-$C_{20}$ alkenyl groups such as vinyl group, allyl group, methallyl group, 1-propenyl group, isopropenyl group, 1-butenyl group, 2-butenyl group, 3-butenyl group, 1-pentenyl group, 2-pentenyl group, 3-pentenyl group, 4-pentenyl group, and 5-hexenyl group, of which $C_2$-$C_{10}$ alkenyl groups are preferred, and $C_2$-$C_4$ alkenyl groups are more preferred; $C_3$-$C_{12}$ cycloalkenyl groups such as cyclohexenyl group; $C_4$-$C_{15}$ bridged unsaturated hydrocarbon groups such as bicycloheptenyl group; ($C_2$-$C_4$ alkenyl)-substituted aryl groups such as styryl group; and cinnamyl group. Examples of the group having an aliphatic carbon-carbon double bond further include groups represented by Formula (s) were at least one of three R's is the above-mentioned group such as $C_2$-$C_{20}$ alkenyl group, $C_3$-$C_{12}$ cycloalkenyl group, $C_4$-$C_{15}$ bridged unsaturated hydrocarbon group, ($C_2$-$C_4$ alkenyl)-substituted aryl group, or cinnamyl group. Among them, $R^1$ is preferably an alkenyl group, more preferably a $C_2$-$C_{20}$ alkenyl group, and furthermore preferably vinyl group.

$R^2$s (three $R^2$s) in Formula (2) are each independently a hydrocarbon group (monovalent hydrocarbon group). The hydrocarbon group may be the same as the hydrocarbon groups exemplified as Rs. Among them, $R^2$s are each preferably a $C_1$-$C_{20}$ alkyl group, more preferably a $C_1$-$C_{10}$ alkyl group, furthermore preferably a $C_1$-$C_4$ alkyl group, and particularly preferably methyl group. In a particularly preferred embodiment, all $R^2$s in Formula (2) are methyl groups.

The polyorganosilsesquioxane residue (a) may further include another unit structure such as one represented by Formula (1') in addition to the unit structures represented by Formulae (1) and (2), where Formula (1') is expressed as follows:

[Chem. 15]

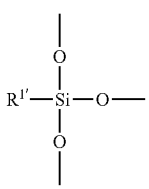

(1')

$R^{1'}$ in Formula (1') represents a monovalent group except for the group having an aliphatic carbon-carbon double bond. Specifically, $R^{1'}$ is exemplified by hydrogen atom; a halogen atom; a monovalent organic group except for the group having an aliphatic carbon-carbon double bond; a monovalent oxygen-containing group; a monovalent nitrogen-containing group; and a monovalent sulfur-containing group.

The polyorganosilsesquioxane residue (a) may contain the silicon atom, which is indicated in Formula (1) and bonded to three oxygen atoms, in a content not critical, but preferably from 20 to 80 mole percent, and more preferably from 25 to 60 mole percent, based on the total amount (100 mole percent) of silicon atoms forming the polyorganosilsesquioxane residue (a). The polyorganosilsesquioxane residue (a), if containing the specific silicon atom in a content of less than 20 mole percent, may cause the ladder-type silsesquioxane (A) to have aliphatic carbon-carbon double bonds in an insufficient amount and may thereby fail to contribute to sufficient hardness of the cured product. In contrast, the polyorganosilsesquioxane residue (a), if containing the specific silicon atom in a content of greater than 80 mole percent, may cause the ladder-type silsesquioxane (A) to fail to be obtained in liquid form because large amounts of silanol groups and hydrolyzable silyl groups remain therein. In addition, this may give a product having inferior storage stability because a condensation reaction proceeds in the product to vary the molecular weight thereof.

The polyorganosilsesquioxane residue (a) may contain the silicon atom, which is indicated in Formula (2) and bonded to one oxygen atom, in a content not critical, but preferably from 20 to 85 mole percent, and more preferably from 30 to 75 mole percent, based on the total amount (100 mole percent) of silicon atoms forming the polyorganosilsesquioxane residue (a). The polyorganosilsesquioxane residue (a), if containing the specific silicon atom in a content of less than 20 mole percent, may cause the ladder-type silsesquioxane (A) to fail to be obtained in liquid form because large amounts of silanol groups and hydrolyzable silyl groups remain therein. In addition, this may give a product having inferior storage stability because a condensation reaction proceeds in the product to vary the molecular weight thereof. In contrast, the polyorganosilsesquioxane residue (a), if containing the specific silicon atom in a content of greater than 85 mole percent, may cause the ladder-type silsesquioxane (A) to have aliphatic carbon-carbon double bonds in an insufficient amount and to thereby fail to contribute to sufficient hardness of the cured product.

The polyorganosilsesquioxane residue (a) may have a Si—O—Si structure (skeleton) of any type not limited, such as a ladder structure, cage structure, or random structure.

The polyorganosilsesquioxane (A) may be represented typically by Formula ($L^a$). In Formula ($L^a$), p and Rs may be the same as in Formula (L). $R^a$s in Formula ($L^a$) are independently a polyorganosilsesquioxane residue (a) or one selected from the group consisting of hydroxyl group, a halogen atom, an alkoxy group, and an acyloxy group, where part or all of $R^a$s are polyorganosilsesquioxane residues (a). When two or more (two to four) of $R^a$s in Formula ($L^a$) are polyorganosilsesquioxane residues (a), each of the $R^a$s may be bonded to each other via one or more Si—O—Si bonds. Formula ($L^a$) is expressed as follows:

[Chem. 16]

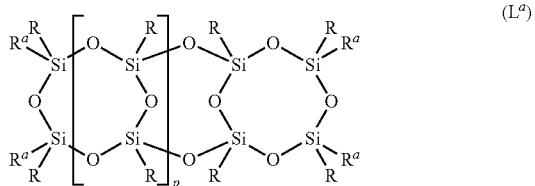

($L^a$)

The polyorganosilsesquioxane residue (a) in the ladder-type silsesquioxane (A) may further have a unit structure represented by Formula (3) described in the ladder-type silsesquioxane (B). In this case, the ladder-type silsesquioxane (A) may be usable also as a ladder-type silsesquioxane (B).

The ladder-type silsesquioxane (A) may be produced by a method not limited, such as a method of forming the silsesquioxane residue (a) in one or more molecular chain terminals of a material ladder polymer. The term "material ladder polymer" as used herein refers to a polyorganosilsesquioxane having a ladder structure and having a silanol group and/or a hydrolyzable silyl group (either one or both of silanol group and a hydrolyzable silyl group) in a molecular chain terminal or terminals.

The hydrolyzable silyl group in the material ladder polymer is exemplified by a halogenated silyl group, an alkoxysilyl group, and an acyloxysilyl group. The halogen atom (halogen moiety) in the halogenated silyl group is exemplified by fluorine atom, chlorine atom, bromine atom, and iodine atom. The alkoxy moiety in the alkoxysilyl group is exemplified by $C_1$-$C_{10}$ alkoxy groups such as methoxy group, ethoxy group, propoxy group, isopropyloxy group, butoxy group, and isobutyloxy group. The acyloxy moiety in the acyloxysilyl group is exemplified by $C_1$-$C_{10}$ acyloxy groups such as acetyloxy group, propionyloxy group, and benzoyloxy group.

The material ladder polymer is exemplified by a polyorganosilsesquioxane of Formula (L) where part or all of the terminal groups T are independently selected from the group consisting of hydroxyl group, a halogen atom, an alkoxy group, and an acyloxy group.

The material ladder polymer may have the silanol group and hydrolyzable silyl group in a number (total number) not critical, but preferably 1 or more (e.g., from 1 to 10), and more preferably from 2 to 6 per molecule. The number (total number) of the silanol group and hydrolyzable silyl group in the material ladder polymer may be determined typically by $^1$H-NMR spectrometry.

The material ladder polymer may have a molecular weight not critical, but preferably from 100 to 800000, more preferably from 200 to 100000, furthermore preferably from 300 to 30000, and particularly preferably from 1000 to 20000. The material ladder polymer, if having a molecular weight of less than 100, may cause the cured product to have insufficient heat resistance. In contrast, the material ladder polymer, if having a molecular weight of greater than 800000, may cause the ladder-type silsesquioxane (A) (or (B)) to have inferior compatibility with another component. The material ladder polymer may be a mixture of ones having different molecular weights falling within the range. The molecular weight may be determined typically by calculation as a molecular weight in terms of a polystyrene standard as measured by gel permeation chromatography.

The material ladder polymer may have a weight-average molecular weight (Mw) not critical, but preferably from 100 to 800000, more preferably from 200 to 100000, furthermore preferably from 300 to 30000, and particularly preferably from 1000 to 20000. The material ladder polymer, if having a weight-average molecular weight of less than 100, may cause the cured product to have insufficient heat resistance. In contrast, the material ladder polymer, if having a weight-average molecular weight of greater than 800000, may cause the ladder-type silsesquioxane (A) (or (B)) to have insufficient compatibility with another component. The weight-average molecular weight may be determined typically by calculation from a molecular weight in terms of a polystyrene standard as measured by gel permeation chromatography.

The material ladder polymer may be produced by a known or common ladder-structure polyorganosilsesquloxane production method not limited. Specifically, the material ladder polymer may be produced by the hydrolysis-condensation reaction (sol-gel reaction) of a trifunctional silane compound.

The production method of the material ladder polymer by the hydrolysis-condensation reaction of a trifunctional silane compound is exemplified by a method of subjecting at least one trifunctional silane compound to a hydrolysis-condensation reaction (sol-gel reaction), where the trifunctional silane compound is represented by Formula (i) expressed as follows:

[Chem. 17]

$$RSiY_3 \qquad (i)$$

where R is as defined above; three Ys are independently selected from the group consisting of hydroxyl group, a halogen atom, an alkoxy group, and an acyloxy group.

The hydrolysis-condensation reaction may be performed typically by subjecting at least one trifunctional silane compound represented by Formula (i) to silanol condensation in the presence of a silanol condensation catalyst in water or a solvent mixture of water and an organic solvent; and distilling off the solvent and/or a by-product (such as an alcohol) during or after the reaction. The reaction may be performed at a temperature not critical, but preferably from −78° C. to 150° C. and more preferably from −20° C. to 100° C. The water may be used in an amount not critical, but preferably 1 mole or more (e.g., from 1 to 20 moles) and more preferably from 1 to 10 moles, per 1 mole of the total amount of the trifunctional silane compound represented by Formula (i).

The organic solvent is exemplified by aliphatic hydrocarbons such as hexane, heptane, and octane; alicyclic hydrocarbons such as cyclohexane; aromatic hydrocarbons such as benzene, toluene, xylenes, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; alcohols such as methanol, ethanol, isopropyl alcohol, and butanol; and mixtures of them. The organic solvent may be used in an amount not critical, but typically from 0.5 to 30 parts by volume per 1 part by volume of the total amount of the material trifunctional silane compound.

The silanol condensation catalyst for use herein may be an acid catalyst or a base catalyst. The acid catalyst is exemplified by mineral acids such as hydrochloric acid, sulfuric acid, nitric acid, phosphoric acid, and boric acid; phosphoric esters; carboxylic acids such as acetic acid and trifluoroacetic acid; sulfonic acids such as methanesulfonic acid, trifluoromethanesulfonic acid, and p-toluenesulfonic acid; solid acids such as activated clay; and Lewis acids such as iron chloride. The base catalyst is exemplified by alkali metal hydroxides such as sodium hydroxide and potassium hydroxide; alkaline earth metal hydroxides such as barium hydroxide and magnesium hydroxide; alkali metal carbonates such as sodium carbonate; alkaline earth metal carbonates such as barium carbonate and magnesium carbonate; alkali metal hydrogencarbonates such as sodium hydrogencarbonate; alkali metal alkoxides such as sodium methoxide and sodium ethoxide; alkaline earth metal alkoxides such as barium methoxide; alkali metal phenoxides such as sodium phenoxide;

quaternary ammonium hydroxides including tetraalkylammonium hydroxides such as tetramethylammonium hydroxide and tetrabutylammonium hydroxide; quaternary phosphonium hydroxides including tetraalkylphosphonium hydroxides such as tetramethylphosphonium hydroxide and tetrabutylphosphonium hydroxide; amines including tertiary amines such as triethylamine, N-methylpiperidine, 4-dimethylaminopyridine, and 1,8-diazabicyclo[5.4.0]-7-undecene (DBU); and nitrogen-containing aromatic heterocyclic compounds such as pyridine. The silanol condensation catalyst for use herein is further exemplified by fluorine compounds such as tetrabutylammonium fluoride, potassium fluoride, and sodium fluoride.

The resulting material ladder polymer may be separated and purified by a separation process such as water washing, acid washing, alkali washing, filtration, concentration, distillation, extraction, crystallization, recrystallization, or column chromatography; or a separation process as any combination of them.

Next, the polyorganosilsesquioxane residue (a) is formed in a molecular chain terminal or terminals of the material ladder polymer to yield a ladder-type silsesquioxane (A). The way to form the polyorganosilsesquioxane residue (a) is exemplified by, but not limited to, a process of subjecting the material ladder polymer to a reaction (condensation, or hydrolysis and condensation) with a trifunctional silane compound represented by Formula (I), and subjecting the resulting compound to a reaction (condensation, or hydrolysis and condensation) with a monofunctional silane compound represented by Formula (II), where Formula (I) is expressed as follows:

[Chem. 18]

$$R^1SiY_3 \quad (I)$$

where $R^1$ is as defined above; and Ys are independently selected from the group consisting of hydroxyl group, a halogen atom, an alkoxy group, and an acyloxy group, and Formula (II) is expressed as follows:

[Chem. 19]

$$R^2_3SiY \quad (II)$$

where $R^2$s are as defined above; and Y is selected from the group consisting of hydroxyl group, a halogen atom, an alkoxy group, and an acyloxy group.

In the reaction with the material ladder polymer, the trifunctional silane compound represented by Formula (I) may be used in an amount not critical, but preferably from 0.2 to 50 moles, more preferably from 0.25 to 10 moles, and furthermore preferably from 1 to 5 moles, per 1 mole of the total amount of silanol groups and hydrolyzable silyl groups of the material ladder polymer. The trifunctional silane compound, if used in an amount of less than 0.2 mole, may fail to introduce the aliphatic carbon-carbon double bond in a sufficient amount into the material ladder polymer. In contrast, the trifunctional silane compound, if used in an amount of greater than 50 moles, may readily cause the trifunctional silane compound to form a condensate between its own molecules and may cause the formation of such low-molecular-weight condensate in a larger amount.

The trifunctional silane compound represented by Formula (I) may be used in the reaction in combination with another trifunctional silane compound (hereinafter also referred to as "other trifunctional silane compound"). Specifically, the material ladder polymer may be subjected to a reaction (co-condensation reaction) with the trifunctional silane compound represented by Formula (I) and the other trifunctional silane compound. The other trifunctional silane compound is exemplified by trifunctional silane compounds of Formula (I) where $R^1$ is a monovalent organic group (e.g., a saturated aliphatic hydrocarbon group or an aromatic hydrocarbon group) other than the group having an aliphatic carbon-carbon double bond. The other trifunctional silane compound, when employed in combination, may be used in an amount not critical, but preferably from 0.2 to 50 parts by weight and more preferably from 0.25 to 10 parts by weight, per 100 parts by weight of the trifunctional silane compound represented by Formula (I).

The material ladder polymer is subjected to the reaction (condensation, or hydrolysis and condensation) with the trifunctional silane compound(s) (trifunctional silane compound represented by Formula (I) alone, or the trifunctional silane compound represented by Formula (I) in combination with the other trifunctional silane compound). The reaction is preferably allowed to proceed in an organic solvent. The organic solvent is exemplified by aliphatic hydrocarbons such as hexane, heptane, and octane; alicyclic hydrocarbons such as cyclohexane; aromatic hydrocarbons such as benzene, toluene, xylene, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile and benzonitrile; and alcohols such as methanol, ethanol, isopropyl alcohol, and butanol. Each of different organic solvents may be used alone or in combination. Among them, methyl isobutyl ketone is preferred.

The reaction between the material ladder polymer and the trifunctional silane compound(s) may be allowed to proceed in the presence of water. The water may be used in an amount not critical, but preferably from 1 to 1.0 moles, more preferably from 1.5 to 6 moles, and furthermore preferably from 2 to 4 moles, per 1 mole of the total amount of hydrolyzable silyl groups present in the system. Water, if used in an amount of less than 1 mole, may fail to allow the hydrolysis to proceed, and this may impede sufficient proceeding of the condensation reaction. In contrast, water, if used in an amount of greater than 10 moles, may impede sufficient proceeding of the reaction because of a lowered reaction rate due to a lowered concentration of the silane compound.

The reaction between the material ladder polymer and the trifunctional silane compound(s) is preferably allowed to proceed further in the presence of a silanol condensation catalyst (of which an acid catalyst is more preferred). The silanol condensation catalyst is exemplified by those for use in the material ladder polymer production. The silanol condensation catalyst may be used in an amount not critical, but preferably from 0.001 to 0.5 mole, more preferably from 0.005 to 0.3 mole, and furthermore preferably from 0.01 to 0.1 mole, per 1 mole of the total amount of silanol groups and hydrolyzable silyl groups present in the system. The silanol condensation catalyst, if used in an amount of less than 0.001 mole, may cause the condensation reaction to proceed insufficiently. In contrast, the silanol condensation catalyst, if used in an amount of greater than 0.5 mole, may cause a side reaction and/or a decomposition reaction to occur coincidentally, and this may cause the target product to be produced in a lower yield.

The reaction between the material ladder polymer and the trifunctional silane compound(s) may be performed at a temperature (reaction temperature) not critical, but preferably from 50° C. to 100° C., more preferably from 60° C. to 90° C., and furthermore preferably from 70° C. to 80° C. The reaction, if performed at a temperature of lower than 50° C., may proceed insufficiently as the condensation reaction. In contrast, the reaction, if performed at a temperature of higher than 100° C., may cause a side reaction and/or a decomposition reaction to occur coincidentally, and this may cause the target product to be produced in a lower yield.

The reaction between the material ladder polymer and the trifunctional silane compound(s) may be performed for a time (reaction time) not critical, but preferably from 15 to 720 minutes, more preferably from 30 to 360 minutes, and furthermore preferably from 60 to 240 minutes. The reaction, if performed for a time of shorter than 15 minutes, may proceed insufficiently as the condensation reaction. In contrast, the reaction, if performed for a time of longer than 720 minutes, may cause a side reaction and/or a decomposition reaction to occur coincidentally and this may cause the target product to be produced in a lower yield.

The reaction between the material ladder polymer and the trifunctional silane compound(s) gives a condensate between the material ladder polymer and the trifunctional silane compound(s) (hereinafter also simply referred to as a "condensate"). The condensate obtained in the above manner may be subjected to a subsequent (downstream) reaction without purification or after purification. The subsequent reaction is a reaction with the monofunctional silane compound represented by Formula (II). The purification may employ a known or common technique including a separation process such as water washing, acid washing, alkali washing, filtration, concentration, distillation, extraction, crystallization, recrystallization, or column chromatography, or a separation process as any combination of them.

Next, the condensate between the material ladder polymer and the trifunctional silane compound(s) is subjected to a reaction with the monofunctional silane compound represented by Formula (II) (monofunctional silane compound). More specifically, silanol groups and hydrolyzable silyl groups of the condensate between the material ladder polymer and the trifunctional silane compound(s) are end-capped with the monofunctional silane compound represented by Formula (II) to form a ladder-type silsesquioxane (A). Specifically, the ladder-type silsesquioxane (A) has a structure where silanol groups and hydrolyzable silyl groups in the condensate are end-capped with the monofunctional silane compound represented by Formula (II).

The monofunctional silane compound represented by Formula (II) may be used in an amount not critical, but preferably from 1 to 10 moles, more preferably from 1 to 5 moles, and furthermore preferably from 1 to 3 moles, per 1 mole of the total amount of silanol groups and hydrolyzable silyl groups of the condensate. The monofunctional silane compound, if used in an amount of less than 1 mole, may readily cause the silanol group and/or hydrolyzable silyl group to remain in a large amount in the ladder-type silsesquioxane (A) and in the cured product and may cause the cured product to have inferior storage stability. In contrast, the monofunctional silane compound, if used in an amount of more than 10 moles, may invite a disadvantage in cost.

The reaction between the condensate and the monofunctional silane compound represented by Formula (II) is preferably allowed to proceed in an organic solvent. The organic solvent may be any of those exemplified in the condensation reaction between the material ladder polymer and the trifunctional silane compound(s).

The reaction between the condensate and the monofunctional silane compound represented by Formula (II) may be performed in the presence of water. The water may be used in an amount not critical, but preferably from 1 to 10 moles, more preferably from 1 to 5 moles, and furthermore preferably from 1 to 3 moles, per 1 mole of the total amount of hydrolyzable silyl groups present in the system. The water, if used in an amount of less than 1 mole, may cause the hydrolysis to proceed insufficiently and may thereby cause the condensation reaction to proceed insufficiently. In contrast, the water, if used in an amount of greater than 10 moles, may cause a lowered reaction rate due to a lowered substrate concentration.

The reaction between the condensate and the monofunctional silane compound represented by Formula (II) is preferably allowed to proceed in the coexistence of a silanol condensation catalyst (of which an acid catalyst is more preferred). The silanol condensation catalyst may be used in an amount not critical, but preferably from 0.0001 to 1.0 mole, more preferably from 0.001 to 0.1 mole, and furthermore preferably from 0.005 to 0.03 mole, per 1 mole of the total amount of silanol groups and hydrolyzable silyl groups present in the system. The silanol condensation catalyst, if used in an amount of less than 0.0001 mole, may cause the condensation reaction to proceed insufficiently due to a lowered reaction rate. In contrast, the silanol condensation catalyst, if used in an amount of greater than 1.0 mole, may cause a side reaction to readily proceed.

The reaction between the condensate and the monofunctional silane compound represented by Formula (II) may be performed at a temperature (reaction temperature) not critical, but preferably from 50° C. to 100° C., more preferably from 60° C. to 80° C., and furthermore preferably from 65° C. to 75° C. The reaction, if performed at a temperature of lower than 50° C., may proceed insufficiently as the condensation reaction. In contrast, the reaction, if performed at a temperature of higher than 100° C., may cause a side reaction and/or a decomposition reaction to occur coincidentally and this may cause the target product to be produced in a lower yield.

The reaction between the condensate and the monofunctional silane compound represented by Formula (II) may be performed for a time (reaction time) not critical, but preferably from 60 to 600 minutes, more preferably from 90 to 360 minutes, and furthermore preferably from 120 to 240 minutes. The reaction, if performed for a time of shorter than 60 minutes, may proceed insufficiently as the condensation reaction. In contrast, the reaction, if performed for a time of longer than 600 minutes, may cause a side reaction and/or a decomposition reaction to occur coincidentally and may thereby cause the product to have a lower molecular weight.

The resulting ladder-type silsesquioxane (A) may be purified by a known or common technique including a separation process such as water washing, acid washing, alkali washing, filtration, concentration, distillation, extraction, crystallization, recrystallization, or column chromatography, or a separation process as any combination of them.

The ladder-type silsesquioxane (A) may have an aliphatic carbon-carbon double bond in a number not critical, but preferably 2 or more (e.g., from 2 to 50) and more preferably from 2 to 30 per molecule (in one molecule). The ladder-type silsesquioxane (A), when having the aliphatic carbon-carbon double bond in a number within the range, can readily give a cured product excellent in heat resistance and other properties, cracking resistance, and barrier properties to a corrosive gas.

The ladder-type silsesquioxane (A) may contain the aliphatic carbon-carbon double bond in a content not critical, but preferably from 0.7 to 5.5 mmol/g and more preferably from 1.1 to 4.4 mmol/g. The ladder-type silsesquioxane (A) may contain the aliphatic carbon-carbon double bond in a percentage (by weight) not critical, but preferably from 2.0 to 15.0 percent by weight and more preferably from 3.0 to 12.0 percent by weight in terms of vinyl group.

The ladder-type silsesquioxane (A) may have a molecular weight not critical, but preferably from 100 to 800000, more preferably from 200 to 100000, furthermore preferably from 300 to 10000, and particularly preferably from 500 to 8000. The ladder-type silsesquioxane (A), when having a molecular weight within the range, may readily become liquid at room temperature and may readily have a relatively low viscosity. This may allow the ladder-type silsesquioxane (A) to be handled easily. The ladder-type silsesquioxane (A) may be a mixture of ones having different molecular weights falling within the range. The molecular weight can be measured typically as a molecular weight in terms of a polystyrene standard by gel permeation chromatography.

The ladder-type silsesquioxane (A) has a weight-average molecular weight (Mw) not critical, but preferably from 100 to 800000, more preferably from 200 to 100000, furthermore preferably from 300 to 10000, and particularly preferably from 500 to 8000. The ladder-type silsesquioxane (A), if having a weight-average molecular weight of less than 100, may cause the cured product to have insufficient heat resistance. In contrast, the ladder-type silsesquioxane (A), if having a weight-average molecular weight of greater than 800000, may have insufficient compatibility with another component. The weight-average molecular weight may be determined typically by calculation from a molecular weight in terms of a polystyrene standard as measured by gel permeation chromatography.

The ladder-type silsesquioxane (A) is preferably, but not limited to, one that is liquid at room temperature (about 25° C.). More specifically, the ladder-type silsesquioxane (A) has a viscosity at 23° C. of preferably from 100 to 100000 mPa·s, more preferably from 500 to 10000 mPa·s, and furthermore preferably from 1000 to 8000 mPa·s. The ladder-type silsesquioxane (A), if having a viscosity of less than 100 mPa·s, may cause the cured product to have inferior heat resistance. In contrast, the ladder-type silsesquioxane (A), if having a viscosity of greater than 100000 mPa·s, may cause the curable resin composition to be prepared and/or to be handled uneasily. The viscosity at 23° C. may be measured typically with a rheometer (trade name "Physica UDS-200", supplied by Anton Paar GmbH) and a cone-plate (with a cone diameter of 16 mm and a taper angle of 0 degree) at a temperature of 23° C. and a number of revolutions of 20 rpm.

The curable resin composition according to the embodiment of the present invention may employ each of different ladder-type silsesquioxanes (A) alone or in combination.

The curable resin composition according to the embodiment of the present invention may contain the ladder-type silsesquioxane(s) (A) in a content (blending quantity) not critical, but preferably from 10 to 90 percent by weight, more preferably from 15 to 80 percent by weight, and furthermore preferably from 20 to 70 percent by weight, based on the total amount (100 percent by weight) of the curable resin composition. The curable resin composition, if containing the ladder-type silsesquioxane(s) (A) in a content of less than 10 percent by weight, may cause the cured product to have insufficient hardness. In contrast, the curable resin composition, if containing the ladder-type silsesquioxane(s) (A) in a content of greater than 90 percent by weight, may cause the cured product to have insufficient hardness.

Ladder-Type Silsesquioxane (B)

The ladder-type silsesquioxane (B) for use in the curable resin composition according to the embodiment of the present invention includes a polyorganosilsesquioxane (polyorganosilsesquioxane skeleton) having a ladder structure; and a polyorganosilsesquioxane residue (b) in part or all of molecular chain terminals of the polyorganosilsesquioxane, where the polyorganosilsesquioxane residue (b) includes a unit structure represented by Formula (3) and a unit structure represented by Formula (4) as mentioned later.

The polyorganosilsesquioxane in the ladder-type silsesquioxane (B) is a polysiloxane represented by an empirical formula (basic structural formula) of $RSiO_{1.5}$. The polyorganosilsesquioxane in the ladder-type silsesquioxane (B) is exemplified by those in the polyorganosilsesquioxane in the ladder-type silsesquioxane (A) (e.g., the polyorganosilsesquioxane represented by Formula (L)).

The ladder-type silsesquioxane (B) preferably includes a substituted or unsubstituted aryl group in part or all of side chains particularly from the viewpoint of barrier properties of the cured product to a corrosive gas, as with the ladder-type silsesquioxane (A).

Specifically, when the polyorganosilsesquioxane is represented by Formula (L), the ladder-type silsesquioxane (B) has a structure where part or all of Ts in Formula (L) are substituted with the polyorganosilsesquioxane residue (b).

The polyorganosilsesquioxane residue (b) is a residue including at least a unit structure represented by Formula (3) and a unit structure represented by Formula (4), where Formulae (3) and (4) are expressed as follows:

[Chem. 20]

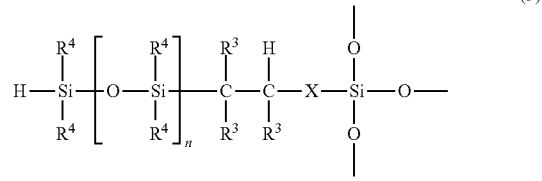

(3)

[Chem. 21]

(4)

The organic group ($-X-CHR^3-CR^3_2-[SiR^4_2-O-]_n-SiHR^4_2$) in the unit structure represented by Formula (3) is hereinafter also referred to as an "SiH-containing group".

In Formula (3), X is selected from the group consisting of single bond and a linkage group (divalent group having one or more atoms). The divalent linkage group is exemplified by divalent hydrocarbon groups, carbonyl group, ether group (ether bond), thioether group (thioether bond), ester group (ester bond), carbonate group (carbonate bond), amido group (amide bond), and groups each including two or more of them linked to each other.

The divalent hydrocarbon groups are exemplified by straight- or branched-chain alkylene groups having 1 to 18 carbon atoms; and divalent alicyclic hydrocarbon groups. The straight- or branched-chain alkylene groups having 1 to 18 carbon atoms are exemplified by methylene group, methylmethylene group, dimethylmethylene group, ethylene group, propylene group, and trimethylene group. The divalent alicyclic hydrocarbon groups are exemplified by divalent cycloalkylene groups (including cycloalkylidene groups), such as 1,2-cyclopentylene group, 1,3-cyclopentylene group, cyclopentylidene group, 1,2-cyclohexylene group, 1,3-cyclohexylene group, 1,4-cyclohexylene group, and cyclohexylidene group.

A plurality of $R^3$s in Formula (3) are independently selected from the group consisting of hydrogen atom, a halogen atom, a monovalent organic group, a monovalent oxygen-containing group, a monovalent nitrogen-containing group, and a monovalent sulfur-containing group. Specifically, $R^3$s may be the same as or different from one another. $R^3$s are exemplified by the groups as with Rs. Among them, $R^3$s are independently preferably selected from hydrogen atom and a substituted or unsubstituted hydrocarbon group and are more preferably hydrogen atoms.

A plurality of $R^4$s in Formula (3) are independently selected from the group consisting of hydrogen atom, a halogen atom, a monovalent organic group, a monovalent oxygen-containing group, a monovalent nitrogen-containing group, and a monovalent sulfur-containing group. Specifically, $R^4$s may be the same as or different from one another. The halogen atom, monovalent organic group, monovalent oxygen-containing group, monovalent nitrogen-containing group, and monovalent sulfur-containing group are exemplified by the groups as with Rs. When n in Formula (3) is an integer of 2 or more, $R^4$s in the brackets with n may each be the same or different.

Among them, $R^4$s are independently preferably hydrogen atom or a substituted or unsubstituted hydrocarbon group; more preferably a substituted or unsubstituted hydrocarbon group; and furthermore preferably an aliphatic hydrocarbon group (of which methyl group is particularly preferred) or an aromatic hydrocarbon group (of which phenyl group is particularly preferred).

The number n in Formula (3) represents an integer of from 1 to 300, is preferably an integer of from 1 to 30, more preferably an integer of from 1 to 10, and furthermore preferably an integer of from 1 to 5. If the number n is excessively large, the curable resin composition may be unsuitable as an encapsulating agent typically for an optical semiconductor element, because the curable resin composition may readily cause the cured product to have insufficient barrier properties to a gas (particularly, a corrosive gas).

The groups $R^5$s (three $R^5$s) in Formula (4) are each independently a hydrocarbon group (monovalent hydrocarbon group). The hydrocarbon group is exemplified by the hydrocarbon groups as with Rs. Among them, $R^5$s are each preferably a $C_1$-$C_{20}$ alkyl group, more preferably a $C_1$-$C_{10}$ alkyl group, furthermore preferably a $C_1$-$C_4$ alkyl group, and particularly preferably methyl group. In a particularly preferred embodiment, all $R^5$s in Formula (4) are methyl groups.

The polyorganosilsesquioxane residue (b) may further have another unit structure such as a unit structure represented by Formula (1'), in addition to the unit structures represented by Formulae (3) and (4).

The polyorganosilsesquioxane residue (b) may contain the silicon atom, which is indicated in Formula (3) and bonded to three oxygen atoms (excluding silicon atom in the SiH-containing group), in a content not critical, but preferably from 20 to 80 mole percent and more preferably from 25 to 60 mole percent, based on the total amount (100 mole percent) of silicon atoms forming the polyorganosilsesquioxane residue (b). The polyorganosilsesquioxane residue (b), if containing the specific silicon atom in a content of less than 20 mole percent, may cause the ladder-type silsesquioxane (B) to have hydrosilyl groups in an insufficient amount and to thereby fail to contribute to sufficient hardness of the cured product. In contrast, the polyorganosilsesquioxane residue (b), if containing the specific silicon atom in a content of greater than 80 mole percent, may cause the ladder-type silsesquioxane (B) to fail to be obtained in liquid form because large amounts of silanol groups and hydrolyzable silyl groups remain in the ladder-type silsesquioxane (B). In addition, this may give a product having inferior storage stability, because a condensation reaction proceeds in the product to vary the molecular weight thereof.

The polyorganosilsesquioxane residue (b) may contain the silicon atom, which is indicated in Formula (4) and bonded to one oxygen atom, in a content not critical, but preferably from 20 to 85 mole percent and more preferably from 30 to 75 mole percent, based on the total amount (100 mole percent) of silicon atoms forming the polyorganosilsesquioxane residue (b). The polyorganosilsesquioxane residue (b), if containing the specific silicon atom in a content of less than 20 mole percent, may cause the ladder-type silsesquioxane (B) to fail to be obtained in liquid form, because silanol groups and hydrolyzable silyl groups may often remain in the ladder-type silsesquioxane (B). In addition, this may give a product having inferior storage stability because a condensation reaction proceeds in the product to vary the molecular weight thereof. In contrast, the polyorganosilsesquioxane residue (b), if containing the specific silicon atom in a content of greater than 85 mole percent, may cause the cured product to have insufficient hardness because the ladder-type silsesquioxane (B) has hydrosilyl groups in an insufficient amount.

The polyorganosilsesquioxane residue (b) may have an Si—O—Si structure (skeleton) of any type not limited, such as a ladder structure, cage structure, or random structure.

The polyorganosilsesquioxane (B) may be represented typically by Formula ($L^b$). In Formula ($L^b$), p and Rs are as in Formula (L). $R^b$s in Formula ($L^b$) are independently a polyorganosilsesquioxane residue (b) or one selected from the group consisting of hydroxyl group, a halogen atom, an alkoxy group, and an acyloxy group, where part or all of $R^b$s in Formula ($L^b$) are polyorganosilsesquioxane residues (b). When two or more (two to four) $R^b$s in Formula ($L^b$) are polyorganosilsesquioxane residues (b), each of $R^b$s may be bonded to each other via one or more Si—O—Si bonds. Formula ($L^b$) is expressed as follows:

[Chem. 22]

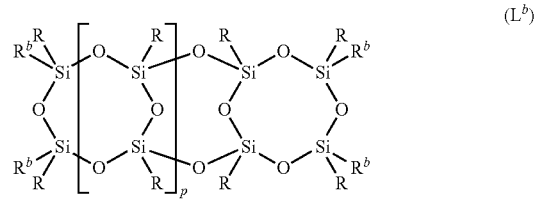

The polyorganosilsesquioxane residue (b) in the ladder-type silsesquioxane (B) may further have a unit structure represented by Formula (1) as in the ladder-type silsesquioxane (A). In this case, the ladder-type silsesquioxane (B) may be usable also as the ladder-type silsesquioxane (A).

The ladder-type silsesquioxane (B) may be produced by any method not limited, such as a method of forming the silsesquioxane residue (b) in one or more molecular chain terminals of a material ladder polymer, where the material ladder polymer is a polyorganosilsesquioxane having a ladder structure and having silanol group and/or hydrolyzable silyl group in one or more molecular chain terminals.

The material ladder polymer used to produce the ladder-type silsesquioxane (B) is exemplified by the material ladder polymers to produce the ladder-type silsesquioxane (A).

The method for forming the polyorganosilsesquioxane residue (b) in one or more molecular chain terminals of the material ladder polymer to produce the ladder-type silsesquioxane (B) is not limited, but is exemplified by a method of forming a ladder-type silsesquioxane (A) from the material ladder polymer; and subjecting the ladder-type silsesquioxane (A) to a reaction with a compound represented by Formula (5) in the presence of a hydrosilylation catalyst, where Formula (5) is expressed as follows:

[Chem. 23]

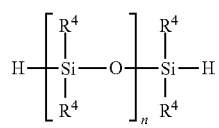

(5)

where $R^4$s and n are as defined above. The production method, however, is not limited to the above method.

The compound represented by Formula (5) is specifically exemplified by straight-chain polydimethylsiloxanes having hydrosilyl groups at both terminals and one to ten (preferably two to five) Si—O units, such as 1,1,3,3-tetramethyldisiloxane, 1,1,3,3,5,5-hexamethyltrisiloxane, 1,1,3,3,5,5,7,7-octamethyltetrasiloxane, and 1,1,3,3,5,5,7,7,9,9-decamethylpentasiloxane; and straight-chain polydialkylsiloxanes having SiH groups at both terminals, of which straight-chain poly(di($C_1$-$C_{10}$ alkyl)siloxane)s are preferred.

The compound represented by Formula (5), when subjected to the reaction with ladder-type silsesquioxane (A), may be used in an amount not critical, but preferably such an amount that hydrosilyl group (Si—H) of the compound represented by Formula (5) is present in an amount of preferably 3 moles or more (e.g., from 3 to 500 moles), more preferably from 5 to 300 moles, furthermore preferably from 8 to 100 moles, and particularly preferably from 8 to 20 moles, per 1 mole of the total amount of aliphatic carbon-carbon double bonds of the ladder-type silsesquioxane (A). The compound represented by Formula (5), if used in such an amount that the hydrosilyl group is present in an amount of less than 3 moles, may cause gelation because a curing reaction between the ladder-type silsesquioxane (A) and the compound represented by Formula (5) may proceed. In contrast, the compound represented by Formula (5), if used in such an amount that the hydrosilyl group is present in an amount of greater than 500 moles, may cause a cost disadvantage.

The hydrosilylation catalyst is exemplified by publicly known hydrosilylation catalysts such as platinum catalysts, rhodium catalysts, and palladium catalysts. Specifically, the hydrosilylation catalyst is exemplified by platinum catalysts such as platinum fine powder, platinum black, platinum-supported silica fine powder, platinum-supported activated carbon, chloroplatinic acid, complexes of chloroplatinic acid typically with an alcohol, an aldehyde, or a ketone, platinum olefin complexes, platinum carbonyl complexes (e.g., platinum-carbonylvinylmethyl complex), platinum vinylmethylsiloxane complexes (e.g., platinum-divinyltetramethyldisiloxane complex and platinum-cyclovinylmethylsiloxane complex), platinum-phosphine complexes, and platinum-phosphite complexes; and palladium catalysts or rhodium catalysts corresponding to the platinum catalysts, except for containing palladium atom or rhodium atom instead of platinum atom. Each of different hydrosilylation catalysts may be used alone or in combination. Among them, platinum vinylmethylsiloxane complexes, platinum-carbonylvinylmethyl complex, and complexes of chloroplatinic acid with an alcohol or an aldehyde are preferred for good reaction rate.

The hydrosilylation catalyst may be used in an amount not critical, but preferably from $1 \times 10^{-8}$ to $1 \times 10^{-2}$ mole and more preferably from $1.0 \times 10^{-6}$ to $1.0 \times 10^{-3}$ mole, per 1 mole of the total amount of aliphatic carbon-carbon double bonds of the ladder-type silsesquioxane (A). The hydrosilylation catalyst, if used in an amount of less than $1 \times 10^{-8}$ mole, may fail to allow the reaction to proceed sufficiently. In contrast, the hydrosilylation catalyst, if used in an amount of greater than $1 \times 10^{-2}$ mole, may cause the cured product to be susceptible to coloration.

The hydrosilylation is performed as the reaction between the ladder-type silsesquioxane (A) and the compound represented by Formula (5) to produce the ladder-type silsesquioxane (B). Where necessary, one or more other additives may be added to the reaction system in the hydrosilylation. The hydrosilylation may be performed in a solvent according to necessity. The solvent is exemplified by the organic solvents as above. The hydrosilylation may be performed in any atmosphere which is not limited, as long as not adversely affecting the reaction, such as an air atmosphere, nitrogen atmosphere, or argon atmosphere. The hydrosilylation can be performed according to any system such as a batch system, semi-batch system, or continuous system.

The hydrosilylation may be performed at a temperature (reaction temperature) not critical, but preferably from 0° C. to 200° C., more preferably from 20° C. to 150° C., and furthermore preferably from 30° C. to 100° C. The hydrosilylation, if performed at a reaction temperature lower than 0° C., may proceed excessively slowly and may cause the target product to be produced with insufficient productivity. In contrast, the hydrosilylation, if performed at a reaction temperature of higher than 200° C., may cause reactant decomposition and/or a side reaction to occur coincidentally, and this may cause the target product to be produced in a lower yield. The reaction temperature may be controlled to be constant or to be varied stepwise or continuously during the reaction.

The hydrosilylation may be performed for a time (reaction time) not critical, but preferably from 10 to 1400 minutes and more preferably from 60 to 720 minutes. The hydrosilylation, if performed for a reaction time of shorter than 10 minutes, may fail to proceed sufficiently, and this may cause the target product to be produced in a lower yield. In contrast, the hydrosilylation, if performed for a reaction time of longer than 1400 minutes, may cause reactant decomposition and/or a side reaction to occur coincidentally, and this may cause the target product to be produced in a lower yield or to be highly colored.

The hydrosilylation can be performed under any pressure (reaction pressure) not critical, such as under normal atmospheric pressure, under a pressure (under a load), or under reduced pressure.

The above-obtained ladder-type silsesquioxane (B) may be purified using a known or common technique including a separation process such as water washing, acid washing, alkali washing, filtration, concentration, distillation, extraction, crystallization, recrystallization, or column chromatography; or a separation process as any combination of them.

The ladder-type silsesquioxane (B) may have the SiH-containing group in a number not critical, but preferably 2 or more (e.g., from 2 to 50) and more preferably from 2 to 30 per molecule (in one molecule). The ladder-type silsesquioxane (B), when having the SiH-containing group in a number within the range, may readily allow the curable resin composition to give a cured product having better heat resistance.

The ladder-type silsesquioxane (B) may have a hydrosilyl group (SiH group) in a content not critical, but preferably from 0.01 to 0.5 mmol/g and more preferably from 0.08 to 0.28 mmol/g. The ladder-type silsesquioxane (B) may have the hydrosilyl group (SiH group) in a content by weight not critical, but preferably from 0.01 to 0.50 percent by weight and more preferably from 0.08 to 0.28 percent by weight, in terms of weight of H (hydrido) in the SiH group (in terms of H). The ladder-type silsesquioxane (B), if having the hydrosilyl group in an excessively low content (e.g., less than 0.01 mmol/g, or less than 0.01 percent by weight in terms of H), may cause curing of the curable resin composition to fail to proceed. In contrast, the ladder-type silsesquioxane (B), if having the hydrosilyl group in an excessively high content (e.g., greater than 0.50 mmol/g, or greater than 0.50 percent by weight in terms of H), may cause the curable resin composition to give a cured product that is susceptible to fracture due to excessively high hardness. The hydrosilyl group content in the ladder-type silsesquioxane (B) can be measured typically by $^1$H-NMR.

The ladder-type silsesquioxane (B) may have the SiH-containing group in a content not critical, but preferably from 50 to 100 mole percent and more preferably from 80 to 100 mole percent, based on the total amount (100 mole percent) of entire hydrosilyl groups of the ladder-type silsesquioxane (B). The range is preferred from the viewpoint of degree of cure.

The ladder-type silsesquioxane (B) may have a molecular weight not critical, but preferably from 100 to 800000, more preferably from 200 to 100000, furthermore preferably from 300 to 10000, and particularly preferably from 500 to 9000. The ladder-type silsesquioxane (B), when having a molecular weight within the range, may readily become liquid at room temperature, may readily have a relatively low viscosity, and may thereby be handled easily. The ladder-type silsesquioxane (B) may be a mixture of ones having different molecular weights falling within the range. The molecular weight may be measured typically as a molecular weight in terms of a polystyrene standard by gel permeation chromatography.

The ladder-type silsesquioxane (B) may have a weight-average molecular weight (Mw) not critical, but preferably from 100 to 800000, more preferably from 200 to 100000, furthermore preferably from 300 to 10000, and particularly preferably from 500 to 9000. The ladder-type silsesquioxane (B), if having a weight-average molecular weight of less than 100, may cause the cured product to have insufficient heat resistance. In contrast, the ladder-type silsesquioxane (B), if having a weight-average molecular weight of greater than 800000, may have insufficient compatibility with another component. The weight-average molecular weight can be determined by typically calculation from a molecular weight in terms of a polystyrene standard as measured by gel permeation chromatography.

The ladder-type silsesquioxane (B) is preferably, but not limited to, one that is liquid at room temperature (about 25° C.). More specifically, the ladder-type silsesquioxane (B) has a viscosity at 23° C. of preferably from 100 to 100000 mPa·s, more preferably from 500 to 10000 mPa·s, and furthermore preferably from 1000 to 8000 mPa·s. The ladder-type silsesquioxane (B), if having a viscosity of less than 100 mPa·s, may cause the cured product to have insufficient heat resistance. In contrast, the ladder-type silsesquioxane (B), if having a viscosity of greater than 100000 mPa·s, may cause the curable resin composition to be prepared and/or to be handled uneasily. The viscosity at 23° C. can be measured typically by the same procedure as with the viscosity of the ladder-type silsesquioxane (A).

The curable resin composition according to the embodiment of the present invention may employ each of different ladder-type silsesquioxanes (B) alone or in combination.

The curable resin composition according to the embodiment of the present invention may contain the ladder-type silsesquioxane(s) (B) in a content (blending quantity) not critical, but preferably from 10 to 90 percent by weight, more preferably from 1.5 to 75 percent by weight, and furthermore preferably from 20 to 60 percent by weight, based on the total amount (100 percent by weight) of the curable resin composition. The curable resin composition, if containing the ladder-type silsesquioxane(s) (B) in a content of less than 10 percent by weight, may cause the cured product to have insufficient hardness. This is because the cured product is insufficiently cured due to a low SiH content. In contrast, the curable resin composition, if containing the ladder-type silsesquioxane(s) (B) in a content of greater than 90 percent by weight, may cause the cured product to be not sufficiently cured due to a low content of carbon-carbon double bond.

Other Ladder-Type Silsesquioxane

The curable resin composition according to the embodiment of the present invention may employ, as a ladder-type polyorganosilsesquioxane, another ladder-type silsesquioxane (hereinafter also referred to as an "other ladder-type silsesquioxane") than the ladder-type silsesquioxanes (A) and the ladder-type silsesquioxanes (B). The other ladder-type silsesquioxane is particularly preferably used in combination with the ladder-type silsesquioxane(s) (A) and/or the ladder-type silsesquioxane(s) (B). Of the other ladder-type silsesquioxanes, particularly preferred are a ladder-type silsesquioxane (S1) and a ladder-type silsesquioxane (S2). The "ladder-type silsesquioxane (S1)" refers to a ladder-type silsesquioxane that is solid at 25° C. and has an aliphatic carbon-carbon double bond. The "ladder-type silsesquioxane (S2)" refers to a ladder-type silsesquioxane that is solid at 25° C. and has a hydrosilyl group. The curable resin composition according to the embodiment of the present invention, when including the ladder-type silsesquioxane (S1) and/or (S2), may particularly readily give a cured product by curing, where the cured product has better barrier properties to a corrosive gas and better toughness (particularly, better cracking resistance).

The ladder-type silsesquioxane (S1) may have the aliphatic carbon-carbon double bond in a number not critical, but preferably 2 or more (e.g., from 2 to 50) and more preferably from 2 to 30 per molecule (in one molecule). The ladder-type silsesquioxane (S1) may have the aliphatic carbon-carbon double bond(s) at any position not limited, such as in a side chain and/or at a terminal.

The ladder-type silsesquioxane (S2) may have the hydrosilyl group in a number not critical, but preferably 2 or more (e.g., from 2 to 50) and more preferably from 2 to 30 per molecule (in one molecule). The ladder-type silsesquioxane (S2) may have the hydrosilyl group(s) at any position not limited, such as in a side chain and/or at a terminal.

The ladder-type silsesquioxanes (S1) and (S2) may each have a weight-average molecular weight (Mw) not critical, but preferably from 2000 to 800000 and more preferably from 6000 to 100000. The ladder-type silsesquioxanes (Si) and (S2), if having a weight-average molecular weight of less than 2000, may cause the cured product to have insufficient barrier properties to a corrosive gas. In contrast, the ladder-type silsesquioxanes (S1) and (S2), if having a weight-average molecular weight of greater than 800000, may have insufficient compatibility with another component. The weight-average molecular weight can be determined typically by calculation from a molecular weight in terms of a polystyrene standard as measured by gel permeation chromatography.

The ladder-type silsesquioxanes (S1) and (S2) may each be produced by a known or common method for producing a ladder-type silsesquioxane. The method is exemplified by a sol-gel process using a trifunctional silane compound as a material.

The curable resin composition may contain the ladder-type silsesquioxane (S1) in a content not critical, but preferably from 0.1 to 80 percent by weight, more preferably from 1 to 50 percent by weight, and furthermore preferably from 1 to 40 percent by weight, based on the total amount (100 percent by weight) of the curable resin composition. The curable resin composition, if containing the ladder-type silsesquioxane (S1) in a content of less than 0.1 percent by weight, may fail to help the cured product to have better cracking resistance and/or better barrier properties to a corrosive gas. In contrast, the curable resin composition, if containing the ladder-type silsesquioxane (S1) in a content of greater than 80 percent by weight, may become nonuniform upon its preparation because of inferior compatibility of the ladder-type silsesquioxane (S1) with another component. The curable resin composition in this case may have an excessively high viscosity and may be handled uneasily. The content of the ladder-type silsesquioxane (S2) is also preferably controlled within the range.

Cyclic Siloxane (C)

The curable resin composition according to the embodiment of the present invention may further include a cyclic siloxane (C). As used herein the term "cyclic siloxane (C)" refers to a cyclic siloxane having two or more aliphatic carbon-carbon double bonds per molecule (in one molecule). The cyclic siloxane (C) may be any siloxane compound not limited, as long as having two or more aliphatic carbon-carbon double bonds per molecule and having a cyclic structure formed by a Si—O bond. The cyclic siloxane (C) is exemplified by a compound represented by Formula (6) and having a group including an aliphatic carbon-carbon double bond. It should be noted, however, that the cyclic siloxane (C) does not include ladder-type polyorganosilsesquioxanes (e.g., the ladder-type silsesquioxanes (A) and the ladder-type silsesquioxanes (B)). Formula (6) is expressed as follows:

[Chem. 24]

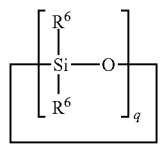

(6)

In Formula (6), $R^6$s may be the same or different and are independently selected from a monovalent organic group that is exemplified by the monovalent organic groups exemplified as Rs. However, two or more of $R^6$s in the compound represented by Formula (6) are each a group having an aliphatic carbon-carbon double bond. The group having an aliphatic carbon-carbon double bond is exemplified by the groups as in $R^1$ in Formula (1). Among them, an alkenyl group is preferred, of which vinyl group is more preferred as the group having an aliphatic carbon-carbon double bond. The number q in Formula (6) represents an integer of 3 or more (e.g., an integer of from 3 to 10), is preferably an integer of from 3 to 7, and is more preferably 4.

The cyclic siloxane (C) is specifically exemplified by 1,3,5,7-tetramethyl-1,3,5,7-tetravinylcyclotetrasiloxane, 1,3,5,7-tetramethyl-1,3,5,7-tetrahexenylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclotrisiloxane, 1,3,5,7,9-pentavinyl-1,3,5,7,9-pentamethylcyclopentasiloxane, and 1,3,5,7,9,11-hexavinyl-1,3,5,7,9,11-hexamethylcyclohexasiloxane. Each of different cyclic siloxanes (C) may be used alone or in combination. Among them, 1,3,5,7-tetramethyl-1,3,5,7-tetravinylcyclotetrasiloxane is particularly preferred as the cyclic siloxane (C). This is because the compound may advantageously readily help the curable resin composition to have a lower initial viscosity and help the cured product to have better barrier properties to a corrosive gas.

The cyclic siloxane (C) may be one further having two or more hydrosilyl groups per molecule. The cyclic siloxane (C) in this case may be usable also as a cyclic siloxane (D) mentioned later.

The curable resin composition according to the embodiment of the present invention may contain the cyclic siloxane(s) (C) in a content (blending quantity) not critical, but preferably from 0.01 to 20 percent by weight, more preferably from 0.1 to 10 percent by weight, and furthermore preferably from 0.5 to 5 percent by weight, based on the total amount (100 percent by weight) of the curable resin composition. The curable resin composition, if containing the cyclic siloxane(s) (C) in a content of less than 0.01 percent by weight, may have an excessively high viscosity and/or may fail to help the cured product to have satisfactory barrier properties to a corrosive gas. In contrast, the curable resin composition, if containing the cyclic siloxane(s) (C) in a content of greater than 20 percent by weight, may cause the cured product to have excessively high hardness. The cured article in this case may be susceptible to cracking and/or susceptible to separation from the adherend.

Cyclic Siloxane (D)

The curable resin composition according to the embodiment of the present invention may include a cyclic siloxane (D). The term "cyclic siloxane (D)" as used herein refers to a cyclic siloxane having two or more hydrosilyl groups per molecule (in one molecule). The cyclic siloxane (D) is not limited, as long as being a siloxane compound having two or more hydrosilyl groups per molecule and having a cyclic structure formed by a Si—O bond, but is exemplified by a compound represented by Formula (7). However, the "cyclic siloxane (D)" herein does not include ladder-type polyorganosilsesquioxanes (e.g., the ladder-type silsesquioxanes (A) and the ladder-type silsesquioxanes (B)). Formula (7) is expressed as follows:

[Chem. 25]

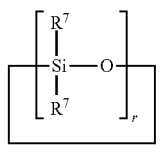

(7)

In Formula (7), $R^7$s may be the same or different and are independently selected from the group consisting of hydrogen atom or a monovalent organic group. The monovalent organic group is exemplified by the monovalent organic groups listed as Rs. However, two or more of $R^7$s in the compound represented by Formula (7) are hydrogen atoms. The number r in Formula (7) represents an integer of 3 or more (e.g., an integer of from 3 to 10), is preferably from an integer of 3 to 7, and is more preferably 4.

The cyclic siloxane (D) is specifically exemplified by cyclic siloxanes having six hydrosilyl groups per molecule, such as cyclotrisiloxane and hexamethylcyclohexasiloxanes (e.g., 1,3,5,7,9,11-hexamethylcyclohexasiloxane); cyclic siloxanes having five hydrosilyl groups per molecule, such as pentamethylcyclopentasiloxanes (e.g., 1,3,5,7,9-pertamethylcyclopentasiloxane); cyclic siloxanes having four hydrosilyl groups per molecule, such as tetramethylcyclotetrasiloxanes (e.g., 1,3,5,7-tetramethylcyclotetrasiloxane); cyclic siloxanes having three hydrosilyl groups per molecule, such as 1-propyl-1,3,5,7-tetramethylcyclotetrasiloxane, trimethylcyclotrisiloxane (1,3,5-trimethylcyclotrisiloxane), pentamethylcyclotetrasiloxanes (e.g., 1,1,3,5,7-pentamethylcyclotetrasiloxane), and heptamethylcyclopentasiloxanes (e.g., 1,1,3,5,5,7,9-heptamnethylcyclopentasiloxanes); and cyclic siloxanes having two hydrosilyl groups per molecule, such as dihexyltetramethylcyclotetrasiloxanes (e.g., 3,7-dihexyl-1,3,5,7-tetramethylcyclotetrasiloxane) and hexamethylcyclotetrasiloxanes (e.g., 1,1,3,5,5,7-hexamethylcyclotetrasiloxane). Each of different cyclic siloxanes (D) may be used alone or in combination. Among them, 1,3,5,7-tetramethylcyclotetrasiloxane is particularly preferred, because the compound may advantageously readily help the curable resin composition to have a lower initial viscosity and help the cured product to have better barrier properties to a corrosive gas.

The cyclic siloxane (D) may be one further having two or more aliphatic carbon-carbon double bonds per molecule. In this case, the cyclic siloxane (D) may be usable also as the cyclic siloxane (C).

The curable resin composition according to the embodiment of the present invention may contain the cyclic siloxane(s) (D) in a content (blending quantity) not critical, but preferably from 0.01 to 30 percent by weight, more preferably from 0.1 to 20 percent by weight, and furthermore preferably from 0.5 to 10 percent by weight, based on the total amount (100 percent by weight) of the curable resin composition. The curable resin composition, if containing the cyclic siloxane(s) (D) in a content of less than 0.01 percent by weight, may fail to help the cured product to have sufficient barrier properties to a corrosive gas. In contrast, the curable resin composition, if containing the cyclic siloxane(s) (D) in a content of greater than 30 percent by weight, may cause the cured product to have excessively high hardness and to be susceptible to cracking.

Hydrosilylation Catalyst

The curable resin composition according to the embodiment of the present invention may further include a hydrosilylation catalyst. The curable resin composition according to the embodiment of the present invention, when including the hydrosilylation catalyst, can allow hydrosilylation of each component to proceed efficiently by heating. The hydrosilylation catalyst is exemplified by those as in the production method for the ladder-type silsesquioxane (B). Each of different hydrosilylation catalysts may be used alone or in combination.

The curable resin composition according to the embodiment of the present invention may contain the hydrosilylation catalyst in a content not critical, but preferably such a content that the amount of platinum, palladium, or rhodium in the hydrosilylation catalyst be from 0.01 to 1,000 ppm, and is more preferably such a content that the amount be from 0.1 to 500 ppm in weight. The curable resin composition, when containing the hydrosilylation catalyst in a content within such range, may not suffer from remarkably low crosslinking rate and might little cause disadvantages of the cured product such as coloring, thus being preferred.

Silane Coupling Agent

The curable resin composition according to the embodiment of the present invention may further include a silane coupling agent. The curable resin composition according to the embodiment of the present invention, particularly when containing the silane coupling agent, may readily help the cured product to have better adhesion to an adherend. In addition, the silane coupling agent may particularly help the isocyanurate compound such as the monoallyl diglycidyl isocyanurate compound to have better compatibility with another component. This is because the silane coupling agent has good compatibility both with the isocyanurate compound (e.g., the monoallyl diglycidyl isocyanurate compound) and the ladder-type silsesquioxane (A). Specifically, when the monoallyl diglycidyl isocyanurate compound is used as the isocyanurate compound, it is preferred that the monoallyl diglycidyl isocyanurate compound is blended with the silane coupling agent to form a composition in advance before being blended with other components. This may readily give a homogeneous resin composition.

The silane coupling agent for use herein can be any of known or common silane coupling agents without limitations. The silane coupling agent is exemplified by epoxy-containing silane coupling agents such as 3-glycidoxypropyltrimethoxysilane, 2-(3,4-epoxycyclohexyl)ethyltrimethoxysilane, 3-glycidoxypropylmethyldiethoxysilane, and 3-glycidoxypropyltriethoxysilane; amino-containing silane coupling agents such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, and N-(β-aminoethyl)-γ-aminopropylmethyldiethoxysilane; and other silane coupling agents such as tetramethoxysilane, tetraethoxysilane, methyltriethoxysilane, dimethyldiethoxysilane, methyltriethoxysilane, vinyltriethoxysilane, vinyltrimethoxysilane, vinyltris(methoxyethoxysilane), phenyltrimethoxysilane, diphenyldimethoxysilane, vinyltriacetoxysilane, γ-(meth)acryloxypropyltriethoxysilane, γ-(meth)acryloxypropyltrimethoxysilane, γ-(meth)acryloxypropylmethyldimethoxysilane, γ-(meth)acryloxypropylmethyldiethoxysilane, mercaptopropylenetrimethoxysilane, and mercaptopropylenetriethoxysilane. Among them, epoxy-containing silane coupling agents are preferably usable, of which 3-glycidoxypropyltrimethoxysilane is particularly preferred. Each of different silane coupling agents may be used alone or in combination.

The curable resin composition may contain the silane coupling agent in a content not critical, but preferably from 0.01 to 15 percent by weight, more preferably from 0.1 to 10 percent by weight, and furthermore preferably from 0.5 to 5 percent by weight, based on the total amount (100 percent by weight) of the curable resin composition. The curable resin composition, if containing the silane coupling agent in a content of less than 0.01 percent by weight, may fail to contribute to satisfactory adhesion to an adherend. This curable resin composition may also fail to allow the isocyanurate compound such as the monoallyl diglycidyl isocyanurate compound to exhibit sufficient advantageous effects when the compound is dissolved (mixed) with another component. In contrast, the curable resin composition, if containing the silane coupling agent in a content of greater than 15 percent by weight, may undergo curing insufficiently and thereby cause the cured product to have inferior toughness, heat resistance, and/or barrier properties.

Hydrosilylation Inhibitor

The curable resin composition according to the embodiment of the present invention may include a hydrosilylation inhibitor so as to control the rate (speed) of the curing reaction (hydrosilylation). The hydrosilylation inhibitor is exemplified by alkyne alcohols such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and thiazole, benzothiazole, and benzotriazole. Each of different hydrosilylation inhibitors may be used alone or in combination. The curable resin composition may contain the curable resin composition in a content of practically preferably from 0.00001 to 5 percent by weight, though the preferred range of content may vary depending on the curing conditions for the curable resin composition.

Other Silane Compound

The curable resin composition according to the embodiment of the present invention may include another silane compound (e.g., a compound having a hydrosilyl group). The other silane compound is exemplified by straight- or branched-chain siloxanes having a SiH group, such as methyl (trisdimethylsiloxy)silane, tetrakis(dimethylsiloxy)silane, 1,1,3,3-tetramethyldisiloxane, 1,1,3,3,5,5-hexamethyltrisiloxane, 1,1,1,3,5,5,5-heptamethyltrisiloxane, 1,1,3,3,5,5,7,7-octamethyltetrasiloxane, 1,1,1,3,5,5,7,7,7-nonamethyltetrasiloxane, 1,1,3,3,5,5,7,7,9,9-decamethylpentasiloxane, and 1,1,1,3,5,5,7,7,9,9,9-undecamethylpentasiloxane. Among them, the silane compound is preferably one having two or more SiH groups per molecule. Each of different silane compounds may be used alone or in combination. The curable resin composition may contain the silane compound in a content not critical, but preferably 5 percent by weight or less (e.g., from 0 to 5 percent by weight) and more preferably 1.5 percent by weight or less, based on the total amount (100 percent by weight) of the curable resin composition.

Solvent

The curable resin composition according to the embodiment of the present invention may include a solvent. The solvent is exemplified by customarily known solvents such as toluene, hexane, isopropyl alcohol, methyl isobutyl ketone, cyclopentanone, and propylene glycol monomethyl ether acetate. Each of different solvents may be used alone or in combination.

Additives

The curable resin composition according to the embodiment of the present invention may include one or more common additives as other arbitrary components. The additives are exemplified by various fillers; solvents; stabilizers such as antioxidants, ultraviolet absorbers, photostabilizers, and thermal stabilizers; flame retardants (phosphorus flame retardants, halogen flame retardants, and inorganic flame retardants; flame retardant promoters; reinforcing materials such as other fillers or bulking agents than those mentioned later; nucleating agents; coupling agents; lubricants; waxes; plasticizers; releasing agents; impact modifiers; hue modifiers; flow improvers; colorants such as dyestuffs and pigments; dispersing agents; antifoaming agents; defoaming agents; antimicrobial agents; antiseptic agents; viscosity modifiers; and thickeners. The various fillers are exemplified by inorganic fillers such as precipitated silica, hydrous silica (wet silica), fumed silica, pyrogenic silica, titanium oxide, alumina, glass, quartz, aluminosilicate, iron oxide, zinc oxide, calcium carbonate, carbon black, silicon carbide, silicon nitride, and boron nitride, as well as inorganic fillers corresponding to the fillers, except for being treated with an organic silicon compound such as an organohalosilane, an organoalkoxysilane, or an organosilazane; fine powders of organic resins such as silicone resins, epoxy resins, and fluorocarbon resins; and electroconductive powders of metals such as silver and copper. Each of different additives may be used alone or in combination.

The silicone resins are exemplified by silicones having two or more hydrosilyl groups or aliphatic carbon-carbon double bonds per molecule (in one molecule), such as phenylsilicones (polydiphenylsiloxanes), phenylmethylsilicones (polymethylphenylsiloxanes), and dimethylsilicones (polydimethylsiloxanes) each having hydrosilyl groups and/or aliphatic carbon-carbon double bonds per molecule.

The curable resin composition according to the embodiment of the present invention may have a formulation (blending formulation) not critical, but may have such a formulation that the aliphatic carbon-carbon double bond is present in an amount of preferably from 0.2 to 4 moles, more preferably from 0.5 to 1.5 moles, and furthermore preferably from 0.8 to 1.2 moles, per 1 mole of hydrosilyl group present in the curable resin composition. The curable resin composition, when having a ratio of the aliphatic carbon-carbon double bond to the hydrosilyl group within the range, may readily allow the cured product to be further better in heat resistance, transparency, flexibility, reflow resistance, and barrier properties to a corrosive gas.

Though not limited, the curable resin composition according to the embodiment of the present invention may be prepared by a method of blending and stirring the components at room temperature. The curable resin composition according to the embodiment of the present invention may be used as a one-part composition as intact, where all the components have been mixed in advance; or a multi-part (e.g., two-part) composition, where, for example, two or more of the components are stored separately and are mixed in a predetermined ratio before use.

Though not limited, the curable resin composition according to the embodiment of the present invention is preferably one that is liquid at room temperature (about 25° C.). More specifically, the curable resin composition according to the embodiment of the present invention has a viscosity at 23° C. of preferably from 300 to 20000 mPa·s, more preferably from 500 to 10000 mPa·s, and furthermore preferably from 1000 to 8000 mPa·s. The curable resin composition, if having a viscosity of less than 300 mPa·s, may cause the cured product to have insufficient heat resistance. In contrast, the curable resin composition, if having a viscosity of greater than 20000 mPa·s, may be prepared and/or handled uneasily and may cause bubbles to readily remain in the cured product. The viscosity of the curable resin composition can be measured typically by the procedure for the measurement of the viscosity of the ladder-type silsesquioxane (A).

Cured Product

The curable resin composition according to the embodiment of the present invention, when cured by hydrosilylation, can give a cured product. The cured product is hereinafter also referred to as "cured product according to the embodiment of the present invention". The curing (hydrosilylation) may be performed under conditions that are not critical and can be suitably selected from among customarily known conditions.

Typically, the curing may be performed at a temperature (curing temperature) of from 25° C. to 180° C. (more preferably from 60° C. to 150° C.) for a time (curing time) of preferably from 5 to 720 minutes. The cured product according to the embodiment of the present invention excels in properties such as heat resistance, transparency, and flexibility, further excels in reflow resistance such as cracking resistance in a reflow process and adhesion to a package, and has excellent barrier properties to a corrosive gas such as a $SO_x$ gas.

Encapsulating Agent

The encapsulating agent according to an embodiment of the present invention is an encapsulating agent including the curable resin composition according to the embodiment of the present invention as an essential component. The encapsulating agent according to the embodiment of the present invention, when cured, gives an encapsulant (cured product). The encapsulant excels in properties such as heat resistance, transparency, and flexibility and also excels in reflow resistance and barrier properties to a corrosive gas. For this reason, the encapsulating agent according to the embodiment of the present invention is advantageously usable typically as an encapsulating agent for a semiconductor element in a semiconductor device; and particularly as an encapsulating agent for an optical semiconductor element in an optical semiconductor device. Of such optical semiconductor elements, the encapsulating agent is more advantageously applicable to an optical semiconductor element for emitting light with a high intensity and a short wavelength. The encapsulating agent according to the embodiment of the present invention, when used in encapsulation of a semiconductor element (particularly, an optical semiconductor element), can give a semiconductor device (particularly, an optical semiconductor device) having excellent durability and quality.

EXAMPLES

The present invention will be illustrated in further detail with reference to several examples below. It should be noted, however, that the examples are by no means intended to limit the scope of the invention.

$^1$H-NMR analyses of reaction products and products were performed with JEOL ECA500 (500 MHz). Number-average molecular weights and weight-average molecular weights of the reaction products and products were measured at 40° C. with Alliance HPLC System 2695 (supplied by Waters Corporation) and Refractive Index Detector 2414 (supplied by Waters Corporation) using two Tskgel $GMH_{HR}$-M columns (supplied by Tosoh Corporation) as columns, Tskgel guard column $H_{HR}L$ (supplied by Tosoh Corporation) as a guard column, COLUMN HEATER U-620 (supplied by Sugai Chemie, Inc.) as a column oven, and THF as a solvent.

Synthetic Example 1

Synthesis of Ladder-Type Silsesquioxane (Prepolymer Corresponding to the Ladder-Type Silsesquioxane (A)) Having a Vinyl Group and a Trimethylsilyl Group (TMS Group) at Terminals In a 200-ml four-necked flask were charged 34.07 g of methyltriethoxysilane (supplied by Shin-Etsu Chemical Co., Ltd.), 11.49 g of phenyltriethoxysilane (supplied by Shin-Etsu Chemical Co., Ltd.), and 17.69 g of methyl isobutyl ketone (MIBK), and a mixture of them was cooled down to 10° C. The mixture was combined with 240 mmol (4.33 g) of water and 0.48 g (2.4 mmol as hydrogen chloride) of 5 N hydrochloric acid both added dropwise concurrently over one hour. After the dropwise addition, a mixture of them was held at 10° C. for one hour. The reaction solvent was then diluted by adding 80.0 g of MIBK.

Next, the reactor temperature was raised up to 70° C., 606 mmol (10.91 g) of water was added at the time point when the temperature reached 70° C., and a polycondensation reaction was performed in a nitrogen atmosphere for 9 hours. In addition 6.25 g of vinyltriethoxysilane was added, followed by a reaction (aging) for 3 hours.

Subsequently 15.0 g of hexamethyldisiloxane was added to the reaction solution, followed by a silylation reaction at 70° C. for 3 hours. The resulting reaction solution was cooled, subjected to water washing until a lower layer liquid became neutral, from which an upper layer liquid was collected. Next, by distilling off the solvent from the upper layer liquid at 60° C. and 1 mmHg, there yielded 21.0 g of a ladder-type silsesquioxane having a vinyl group and a TMS group at terminals as a colorless, transparent liquid product.

The ladder-type silsesquioxane having a vinyl group and a TMS group at terminals had a weight-average molecular weight (Mw) of 3400, a vinyl group content (average content) per molecule of 3.96 percent by weight, and a ratio (molar ratio) of phenyl group to methyl group to vinyl group of 17:68:15.

$^1$H-NMR spectrum of the ladder-type silsesquioxane having a vinyl group and a TMS group at terminals:
$^1$H-NMR (JEOL ECA500 (500 MHz, $CDCl_3$)) δ: −0.3-0.3 ppm (br), 5.7-6.2 ppm (br), 7.1-7.7 ppm (br)

FIG. 1 depicts a $^1$H-NMR spectrum chart of the above-obtained ladder-type silsesquioxane having a vinyl group and a TMS group at terminals.

Synthetic Example 2

Synthesis of Ladder-Type Silsesquioxane Having a SiH-Containing Group and a TMS Group at Terminals (Prepolymer Corresponding to the Ladder-Type Silsesquioxane (B))

In a 50-ml four-necked flask were charged 12 g of the ladder-type silsesquioxane having a vinyl group and a TMS group at terminals obtained in Synthetic Example 1, 24 g of 1,1,3,3-tetramethyldisiloxane (supplied by Tokyo Chemical Industry Co., Ltd.), and 10 μl of a 2.0% platinum-cyclovinyl-siloxane complex vinylcyclosiloxane solution (supplied by Wako Pure Chemical Industries, Ltd.). Next, the mixture was heated at 70° C. for 8 hours, followed by reaction completion. The reaction mixture was concentrated on an evaporator, decompressed at 0.2 Torr for 3 hours using a vacuum pump, and yielded 14.4 g of a ladder-type silsesquioxane having a SiH-containing group and a TMS group at terminals as a liquid product. The ladder-type silsesquioxane having a SiH-containing group and a TMS group at terminals had a weight-average molecular weight (Mw) of 3700 and a SiH group content (average content) per molecule of 0.11 percent by weight in terms of weight of H (hydrido) in the SiH group.

$^1$H-NMR spectrum of the ladder-type silsesquioxane having a SiH-containing group and a TMS group at terminals:
$^1$H-NMR (JEOL ECA500 (500 MHz, $CDCl_3$)) δ: −0.3-0.3 ppm (br), 4.7 ppm (s), 7.1-7.7 ppm (br)

FIG. 2 depicts a $^1$H-NMR spectrum chart of the above-obtained ladder-type silsesquioxane having a SiH-containing group at terminals.

In addition to the polyorganisiloxanes obtained in Synthetic Examples 1 and 2, products as follows were used as polyorganosiloxanes.

OE-6665A: a product of Dow Corning Toray Co., Ltd., having a vinyl group content of 11.97 percent by weight, a phenyl group content of 21.39 percent by weight, a number-average molecular weight of 831, and a weight-average molecular weight of 1455

OE-6665B: a product of Dow Corning Toray Co., Ltd., having a vinyl group content of 3.76 percent by weight, a phenyl group content of 48.58 percent by weight, a SiH group content (in terms of hydrido) of 0.16 percent by weight, a number-average molecular weight of 744, and a weight-average molecular weight of 1274

KER-2500A: a product of Shin-Etsu Chemical Co., Ltd., having a vinyl group content of 1.53 percent by weight, a phenyl group content of 0 percent by weight, a SiH group content (in terms of hydrido) of 0.03 percent by weight, a number-average molecular weight of 4453, and a weight-average molecular weight of 19355

KER-2500B: a product of Shin-Etsu Chemical Co., Ltd., having a vinyl group content of 1.08 percent by weight, a phenyl group content of 0 percent by weight, a SiH group content (in terms of hydrido) of 0.13 percent by weight, a number-average molecular weight of 4636, and a weight-average molecular weight of 18814

GD-1130A: a product of Eternal. Chemical Co., Ltd., having a vinyl group content of 4.32 percent by weight, a phenyl group content of 44.18 percent by weight, a number-average molecular weight of 1107, and a weight-average molecular weight of 6099

GD-1130B: a product of Eternal Chemical Co., Ltd., having a vinyl group content of 3.45 percent by weight, a phenyl group content of 50.96 percent by weight, a SiH group content (in terms of hydrido) of 0.17 percent by weight, a number-average molecular weight of 631, and a weight-average molecular weight of 1305

Example 1

Production of Curable Resin Composition 1 and Cured Product 1 Thereof

Components as follows were mixed and stirred at room temperature for 2 hours and yielded a transparent, homogeneous solution having good compatibility of the components with one another. The components were 0.644 g of the ladder-type silsesquioxane having a SiH-containing group and a TMS group at terminals obtained in Synthetic Example 2; 0.049 g of 1,3,5,7-tetramethylcyclotetrasiloxane; 0.500 g of the ladder-type silsesquioxane having a vinyl group and a TMS group at terminals obtained in Synthetic Example 1; 0.500 g of a powdery ladder-type phenylmethylvinylsilsesquioxane [having a weight-average molecular weight Mw of 7000 and a ratio (molar ratio) of phenyl to methyl to vinyl of 17:68:15]; and a premix of 0.050 g of 1,3,5,7-tetravinyl-1,3,5,7-tetramethylcyclotetrasiloxane and 0.017 g of allyl diglycidyl isocyanurate dissolved in 0.067 g of 3-glycidyloxypropyltrimethoxysilane. The resulting solution was combined with 1.3 µl of a 2.0% platinum-cyclovinylsiloxane complex vinylcyclosiloxane solution (supplied by Wako Pure Chemical Industries, Ltd.), further stirred for 30 minutes, and yielded a curable resin composition (hereinafter referred to as "Curable Resin Composition 1.").

Above-obtained Curable Resin Composition 1 was applied to a glass plate, heated at 90° C. for one hour, subsequently further heated at 150° C. for 5 hours, and yielded a colorless, transparent cured product (hereinafter referred to as "Cured Product 1").

Comparative Example 1

Production of Curable Resin Composition 2 and Cured Product 2 Thereof

Components as follows were mixed and stirred at room temperature for 2 hours and yielded a transparent, homogeneous solution having good compatibility of the components with one another. The components were 0.644 g of the ladder-type silsesquioxane having a SiH-containing group and a TMS group at terminals obtained in Synthetic Example 2; 0.049 g of 1,3,5,7-tetramethylcyclotetrasiloxane; 0.500 g of the ladder-type silsesquioxane having a vinyl group and a TMS group at terminals obtained in Synthetic Example 1; 0.500 g of a powdery ladder-type phenylmethylvinylsilsesquioxane [having a weight-average molecular weight Mw of 7000 and a ratio (molar ratio) of phenyl to methyl to vinyl of 17:68:15]; 0.050 g of 1,3,5,7-tetravinyl-1,3,5,7-tetramethylcyclotetrasiloxane; and 0.067 g of 3-glycidyloxypropyltrimethoxysilane. The resulting solution was combined with 1.3 µl of a 2.0% platinum-cyclovinylsiloxane complex vinylcyclosiloxane solution (supplied by Wako Pure Chemical Industries, Ltd.), stirred for further 30 minutes, and yielded a curable resin composition (hereinafter referred to as "Curable Resin Composition 2").

Above-obtained Curable Resin Composition 2 was applied to a glass plate, heated at 90° C. for one hour, subsequently further heated at 150° C. for 5 hours, and yielded a colorless, transparent cured product (hereinafter referred to as "Cured Product 2").

Comparative Example 2

A curable resin composition was obtained by mixing 0.100 g of OE-6665A with 2.000 g of OE-6665B; and stirring them for 30 minutes. The resulting curable resin composition was applied to a glass plate, heated at 150° C. for 2 hours, and yielded a colorless, transparent cured product.

Comparative Example 3

A curable resin composition was obtained by mixing 1.000 g of KER-2500A with 1.000 g of KER-2500; and stirring them for 30 minutes. The resulting curable resin composition was applied to a glass plate, heated at 100° C. for one hour, subsequently further heated at 150° C. for 4 hours, and yielded a colorless, transparent cured product.

Comparative Example 4

A curable resin composition was obtained by mixing 0.250 g of GD-1130A and 1.000 g of GD-1130B with a premix solution of 0.003 g of methyl diallyl isocyanurate in 0.010 g of 3-glycidyloxypropyltrimethoxysilane; and stirring them for 30 minutes. The resulting curable resin composition was applied to a glass plate, heated at 80° C. for one hour, subsequently further heated at 150° C. for 4 hours, and yielded a colorless, transparent cured product.

Evaluations

Evaluations on Properties of Cured Products

Cured Product 1 obtained in Example 1 was evaluated on properties by test methods both given in Table 1. The evaluation results are indicated in Table 1. FIG. 3 depicts the light transmittance of Cured Product 1 as measured with respect to light at wavelengths of from 300 to 800 nm.

TABLE 1

| Evaluation items | Test method | Unit | Property level (evaluation result) | Remarks (test conditions) |
|---|---|---|---|---|
| Glass transition temperature | DSC (JIS K 7121) | °C. | 32 | — |
| Coefficient of linear expansion α1 α2 | TMA (JIS K 7197) | 1/°C. | $74 \times 10^{-6}$ $287 \times 10^{-6}$ | Rate of temperature rise: 5° C./min |
| Light transmittance | Spectrophotometer | % | 91.7 | 450 nm, 2 mm thick |
| Young's modulus | JIS K 7113 | MPa | 128 | 25° C. |
| Tensile strength | | MPa | 6 | 25° C. |
| Tensile elongation | | % | 9 | 25° C. |
| Water absorption | JIS K 6911 | percent by weight | <0.1 | immersion at 23° C. for 24 hr. |
| Hardness | Durometer | — | 65 | Type A hardness |
| Refractive index | Refractometer | — | 1.45 | 633 nm |
| Cure shrinkage | Specific gravity method | % | 1.4 | — |

Reflow Test

Two specimens per each example (each curable resin composition) were prepared by pouring each of the curable resin composition obtained in Example 1 and Comparative Examples 1 and 2 into an LED package (TOP LED OP-3, 35 mm by 28 mm, without element) and thermally curing the resin composition under conditions given in Table 2. The specimens were allowed to pass through a reflow tester so as to undergo a thermal hysteresis at 260° C. two times, and examined whether cracking (cracks in the cured product) and/or separation (separation of the cured product) occurred based on enlarged images taken at 100-fold magnification with a CCD camera. Of the two specimens per each example, the number of specimen(s) suffering from cracking and/or separation is indicated in Table 2.

TABLE 2

| | | Reflow test result (number) | |
|---|---|---|---|
| | Curing conditions | Cracking | Separation |
| Example 1 | 90° C. for 1 hr. and 150° C. for 5 hr. | 0/2 | 0/2 |
| Comparative Example 1 | 90° C. for 1 hr. and 150° C. for 5 hr. | 0/2 | 0/2 |
| Comparative Example 2 | 150° C. for 2 hr. | 0/2 | 0/2 |

Sulfur Corrosion Resistance Test

A specimen per each example (curable resin composition) was prepared by pouring each of the curable resin compositions obtained in Example 1 and Comparative Examples 1 to 4 into an LED package (TOP LED OP-3, 35 mm by 28 mm, without element) and thermally curing the resin composition under conditions given in Table 3.

The specimen and 0.3 g of a sulfur powder (supplied by KISHIDA CHEMICAL Co., Ltd.) were placed in a 450-ml glass bottle, and the glass bottle was in turn placed in an aluminum case. Next, the aluminum case was placed in an oven (model number "DN-64" supplied by Yamato Scientific Co., Ltd.), and whether and how a silver electrode in the LED package was corroded was visually observed 24 hours, 48 hours, and 72 hours later. The degree of corrosion of the electrode was evaluated on a scale of A, B, and C [A: the electrode had the same color as before the test, and no corrosion was observed; B: the electrode became dark brown, and corrosion was detected; and C: the electrode became black entirely, indicating that the electrode was fully corroded]. The results are indicated in Table 3.

TABLE 3

| | | Sulfur corrosion resistance test result | | |
|---|---|---|---|---|
| | Curing conditions | 24 hr. later | 48 hr. later | 72 hr. later |
| Example 1 | 90° C. for 1 hr. and 150° C. for 5 hr. | A | A | A |
| Comparative Example 1 | 90° C. for 1 hr. and 150° C. for 5 hr. | A | B | B |
| Comparative Example 2 | 150° C. for 2 hr. | B | C | C |
| Comparative Example 3 | 100° C. for 1 hr. and 150° C. for 4 hr. | C | C | C |
| Comparative Example 4 | 80° C. for 1 hr. and 150° C. for 4 hr. | B | C | C |

INDUSTRIAL APPLICABILITY

The curable resin composition and cured product according to the embodiments of the present invention are useful in applications such as adhesives, coating agents, and encapsulating agents each requiring heat resistance, transparency, flexibility, and barrier properties to a corrosive gas. In particular, the curable resin composition and cured product according to the embodiments of the present invention are suitable as encapsulating agents for optical semiconductor elements (light-emitting diodes).

The invention claimed is:

1. A curable resin composition comprising: a ladder-structure polyorganosilsesquioxane; and an isocyanurate compound represented by Formula (8) expressed as follows:

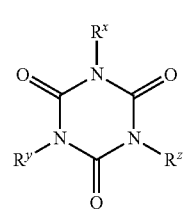

(8)

where $R^x$, $R^y$, and $R^z$ may be the same or different and are independently selected from the group consisting of a group represented by Formula (9) and a group represented by Formula (10), and at least one of $R^x$, $R^y$, and $R^z$ in Formula (8) is a group represented by Formula (10), Formulae (9) and (10) expressed as follows:

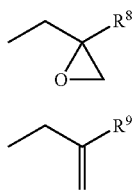
(9)

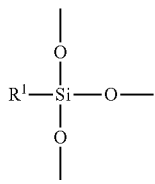
(10)

where $R^8$ and $R^9$ may be the same or different and are independently selected from the group consisting of hydrogen atom and a straight- or branched-chain alkyl group having 1 to 8 carbon atoms.

2. The curable resin composition according to claim 1, comprising a ladder-structure silsesquioxane (A) as the ladder-structure polyorganosilsesquioxane, the ladder-structure silsesquioxane (A) comprising a polyorganosilsesquioxane having a ladder structure; and a polyorganosilsesquioxane residue in part or all of molecular chain terminals of the polyorganosilsesquioxane, the polyorganosilsesquioxane residue comprising a unit structure represented by Formula (1) and a unit structure represented by Formula (2), Formula (1) expressed as follows:

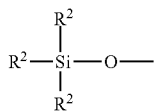
(1)

where $R^1$ is a group having an aliphatic carbon-carbon double bond,
and Formula (2) expressed as follows:

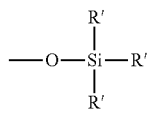
(2)

where $R^2$s are each independently a hydrocarbon group.

3. The curable resin composition according to claim 1, comprising a ladder-structure silsesquioxane (B) as the ladder-structure polyorganosilsesquioxane, the ladder-structure silsesquioxane (B) comprising a polyorganosilsesquioxane having a ladder structure; and a polyorganosilsesquioxane residue in part or all of molecular chain terminals of the polyorganosilsesquioxane, the polyorganosilsesquioxane residue comprising a unit structure represented by Formula (3) and a unit structure represented by Formula (4), Formula (3) expressed as follows:

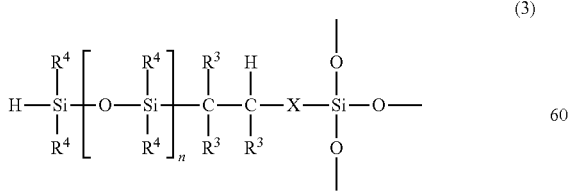
(3)

where X is selected from the group consisting of single bond, divalent hydrocarbon groups, carbonyl group, ether group, thioether group, ester group, carbonate group, amido group, and groups each including two or more of them linked to each other; a plurality of $R^3$s are independently selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, mercapto group, and a group represented by Formula (s) expressed as follows:

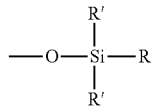
(s)

where a plurality of R's may be the same or different and are selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, and mercapto group; a plurality of $R^4$s are independently selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, mercapto group, and a group represented by Formula (s) expressed as follows:

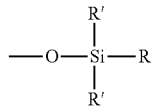
(s)

where a plurality of R's may be the same or different and are selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, and mercapto group; and n represents an integer of from 1 to 100,
and Formula (4) expressed as follows:

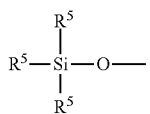

(4)

where $R^5$s are each independently a hydrocarbon group.

4. The curable resin composition according to claim 1, further comprising a cyclic siloxane (C) having two or more aliphatic carbon-carbon double bonds per molecule and a cyclic siloxane (D) having two or more hydrosilyl groups per molecule.

5. The curable resin composition according to claim 1, wherein part or all of side chains of the ladder-structure polyorganosilsesquioxane are independently a substituted or unsubstituted aryl group.

6. The curable resin composition according to claim 1, further comprising a silane coupling agent.

7. A cured product obtained by curing the curable resin composition of claim 1.

8. An encapsulating agent comprising the curable resin composition of claim 1.

9. A semiconductor device obtained by encapsulating a semiconductor element with the encapsulating agent of claim 8.

10. A curable resin composition comprising: a ladder-structure polyorganosilsesquioxane; and an isocyanurate compound represented by Formula (8) expressed as follows:

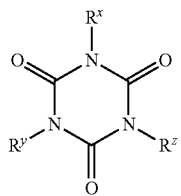

(8)

where $R^x$, $R^y$, and $R^z$ may be the same or different and are independently selected from the group consisting of a group represented by Formula (9) and a group represented by Formula (10), Formulae (9) and (10) expressed as follows:

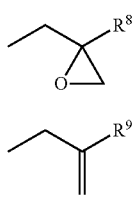

(9)

(10)

where $R^8$ and $R^9$ may be the same or different and are independently selected from the group consisting of hydrogen atom and a straight- or branched-chain alkyl group having 1 to 8 carbon atoms, and comprising at least one of a ladder-structure silsesquioxane (A) and a ladder-structure silsesquioxane (B) as the ladder-structure polyorganosilsesquioxane,
the ladder-structure silsesquioxane (A) comprising a polyorganosilsesquioxane having a ladder structure; and a polyorganosilsesquioxane residue in part or all of molecular chain terminals of the polyorganosilsesquioxane, the polyorganosilsesquioxane residue comprising a unit structure represented by Formula (1) and a unit structure represented by Formula (2), Formula (1) expressed as follows:

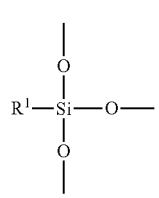

(1)

where $R^1$ is a group having an aliphatic carbon-carbon double bond,
and Formula (2) expressed as follows:

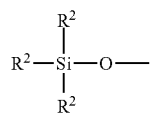

(2)

where $R^2$s are each independently a hydrocarbon group,
the ladder-structure silsesquioxane (B) comprising a polyorganosilsesquioxane having a ladder structure; and a polyorganosilsesquioxane residue in part or all of molecular chain terminals of the polyorganosilsesquioxane, the polyorganosilsesquioxane residue comprising a unit structure represented by Formula (3) and a unit structure represented by Formula (4), Formula (3) expressed as follows:

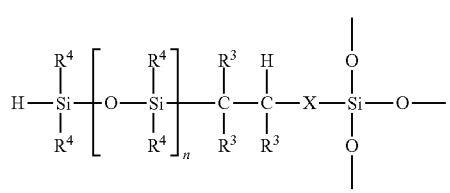

(3)

where X is selected from the group consisting of single bond, divalent hydrocarbon groups, carbonyl group, ether group, thioether group, ester group, carbonate group, amido group, and groups each including two or more of them linked to each other; a plurality of $R^3$s are independently selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, mercapto group, and a group represented by Formula (s) expressed as follows:

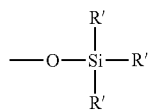
(s)

where a plurality of R's may be the same or different and are selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, and mercapto group; a plurality of $R^4$s are independently selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, mercapto group, and a group represented by Formula (s) expressed as follows:

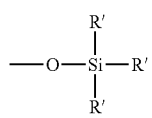
(s)

where a plurality of R's may be the same or different and are selected from the group consisting of hydrogen atom, a halogen atom, substituted or unsubstituted hydrocarbon groups, alkoxy groups, alkenyloxy groups, aryloxy groups, aralkyloxy groups, acyloxy groups, alkylthio groups, alkenylthio groups, arylthio groups, aralkylthio groups, carboxyl group, alkoxycarbonyl groups, aryloxycarbonyl groups, aralkyloxycarbonyl groups, epoxy group, cyano group, isocyanato group, carbamoyl group, isothiocyanato group, hydroxyl group, hydroperoxy group, sulfo group, amino group or substituted amino groups, and mercapto group; and n represents an integer of from 1 to 100, and Formula (4) expressed as follows:

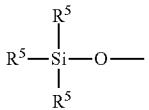
(4)

where $R^5$s are each independently a hydrocarbon group.

11. A curable resin composition according to claim 10, comprising the ladder-structure silsesquioxane (A) as the ladder-structure polyorganosilsesquioxane.

12. The curable resin composition according to claim 11, comprising the ladder-structure silsesquioxane (B) as the ladder-structure polyorganosilsesquioxane.

13. A curable resin composition according to claim 10, comprising the ladder-structure silsesquioxane (B) as the ladder-structure polyorganosilsesquioxane.

14. The curable resin composition according to claim 11, further comprising a cyclic siloxane (C) having two or more aliphatic carbon-carbon double bonds per molecule and a cyclic siloxane (D) having two or more hydrosilyl groups per molecule.

15. The curable resin composition according to claim 12, further comprising a cyclic siloxane (C) having two or more aliphatic carbon-carbon double bonds per molecule and a cyclic siloxane (D) having two or more hydrosilyl groups per molecule.

16. The curable resin composition according to claim 11, wherein part or all of side chains of the ladder-structure polyorganosilsesquioxane are independently a substituted or unsubstituted aryl group.

17. The curable resin composition according to claim 12, wherein part or all of side chains of the ladder-structure polyorganosilsesquioxane are independently a substituted or unsubstituted aryl group.

18. The curable resin composition according to claim 11, further comprising a silane coupling agent.

19. The curable resin composition according to claim 12, further comprising a silane coupling agent.

20. A cured product obtained by curing the curable resin composition of claim 11.

21. A cured product obtained by curing the curable resin composition of claim 12.

22. An encapsulating agent comprising the curable resin composition of claim 11.

23. An encapsulating agent comprising the curable resin composition of claim 12.

24. A semiconductor device obtained by encapsulating a semiconductor element with the encapsulating agent of claim 22.

25. A semiconductor device obtained by encapsulating a semiconductor element with the encapsulating agent of claim 23.

* * * * *